United States Patent
Kwag et al.

(10) Patent No.: US 11,600,649 B2
(45) Date of Patent: Mar. 7, 2023

(54) IMAGE SENSOR

(71) Applicant: SK hynix Inc., Icheon-si (KR)

(72) Inventors: Pyong Su Kwag, Eumseong-gun (KR); Byung Hoon Kim, Cheongju-si (KR)

(73) Assignee: SK HYNIX INC., Icheon-si (KR)

(*) Notice: Subject to any disclaimer, the term of this patent is extended or adjusted under 35 U.S.C. 154(b) by 253 days.

(21) Appl. No.: 16/928,943

(22) Filed: Jul. 14, 2020

(65) Prior Publication Data

US 2021/0242251 A1    Aug. 5, 2021

(30) Foreign Application Priority Data

Jan. 30, 2020 (KR) .................. 10-2020-0010887

(51) Int. Cl.
*H01L 27/146* (2006.01)

(52) U.S. Cl.
CPC .... *H01L 27/1463* (2013.01); *H01L 27/14621* (2013.01); *H01L 27/14627* (2013.01); *H01L 27/14645* (2013.01)

(58) Field of Classification Search
None
See application file for complete search history.

(56) References Cited

U.S. PATENT DOCUMENTS

| | | | | |
|---|---|---|---|---|
| 6,392,232 | B1* | 5/2002 | Gooch | H01L 27/16 257/E27.008 |
| 2012/0193682 | A1* | 8/2012 | Hacker | H01L 23/66 257/209 |
| 2019/0148448 | A1* | 5/2019 | Lee | H01L 27/14627 257/431 |
| 2019/0296960 | A1* | 9/2019 | Shif | H04L 41/046 |
| 2020/0075644 | A1* | 3/2020 | Aoki | H01L 27/1461 |
| 2020/0279877 | A1* | 9/2020 | Kim | H01L 27/1464 |
| 2021/0202546 | A1* | 7/2021 | Liu | H01L 27/1463 |

* cited by examiner

*Primary Examiner* — Ali Naraghi
(74) *Attorney, Agent, or Firm* — Perkins Coie LLP

(57) ABSTRACT

An image sensor is disclosed. The image sensor includes a plurality of photodiodes arranged in first and second directions in a matrix, a plurality of first isolation layers, each two adjacent first isolation layers arranged in the first direction being spaced apart from each other by a first distance, each first isolation layer being interposed between adjacent photodiodes arranged in the second direction, and a plurality of second isolation layers, each two adjacent second isolation layers arranged in the second direction being spaced apart from each other by a second distance, each second isolation layer being interposed between adjacent photodiodes arranged in the first direction.

15 Claims, 31 Drawing Sheets

IMAGE SENSOR

CROSS-REFERENCE TO RELATED APPLICATION

This patent document claims the priority and benefits of Korean patent application No. 10-2020-0010887, filed on Jan. 30, 2020, the disclosure of which is incorporated herein by reference in its entirety as part of the disclosure of this patent document.

TECHNICAL FIELD

The technology and implementations disclosed in this patent document generally relate to an image sensor for generating an electrical signal corresponding to incident light.

BACKGROUND

An image sensor is a device for capturing optical images by converting light into electrical signals using a photosensitive semiconductor material that reacts to light. With the recent development of automotive, medical, computer, and communication industries, the demand for high-performance image sensors is increasing in various devices such as smartphones, digital cameras, game consoles, Internet of Things (IoT), robots, surveillance cameras, medical microcameras, etc.

Image sensors may be broadly classified into charge coupled device (CCD)-based image sensors and CMOS (complementary metal oxide semiconductor)-based image sensors. The CCD image sensors offer the best available image quality, but they tend to consume more power and are larger as compared to CMOS image sensors. The CMOS image sensors are smaller in size and consume less power than the CCD image sensors. The CMOS image sensors may be implemented using many different scanning schemes, and because CMOS sensors are fabricated using the CMOS fabrication technology, the CMOS image sensors and other signal processing circuitry can be integrated into a single chip, enabling the production of small-sized image sensors at a lower cost. For these reasons, the CMOS image sensors are being intensively researched and rapidly coming into widespread use.

SUMMARY

This patent document provides, among others, fabrication methods of image sensors that can avoid a potential collapse of photoresist patterns during a patterning process.

The embodiments of the disclosed technology can be implemented to improve production yield by minimizing defects and variability in the fabrication process.

In an embodiment of the disclosed technology, an image sensor may include a plurality of photodiodes arranged in first and second directions in a matrix, a plurality of first isolation layers, each two adjacent first isolation layers arranged in the first direction being spaced apart from each other by a first distance, each first isolation layer being interposed between adjacent photodiodes arranged in the second direction, and a plurality of second isolation layers, each two adjacent second isolation layers arranged in the second direction being spaced apart from each other by a second distance, each second isolation layer being interposed between adjacent photodiodes arranged in the first direction. A space between two adjacent first isolation layers arranged in the first direction and a space between two adjacent second isolation layers arranged in the second direction overlap to form a blank region surrounded by the two adjacent first isolation layers and the two adjacent second isolation layers within a substrate including the first isolation layers and the second isolation layers.

In another embodiment of the disclosed technology, an image sensor may include a plurality of photodiodes arranged in a matrix shape, a plurality of first isolation layers arranged at regular intervals in first and second directions, each two adjacent first isolation layers arranged in the first direction being spaced apart from each other by a first distance, each first isolation layer being interposed between adjacent photodiodes arranged in the second direction, and a plurality of second isolation layers arranged at regular intervals in the first and second directions, each two adjacent second isolation layers arranged in the second direction being spaced apart from each other by a second distance, each second isolation layer being interposed between adjacent photodiodes arranged in the first direction. A blank region is formed at a region surrounded by four adjacent photodiodes within a substrate including the first isolation layers and the second isolation layers.

In another embodiment of the disclosed technology, an image sensor may include a plurality of photodiodes arranged in first and second directions in a matrix, a plurality of first isolation layers arranged at regular intervals in the first direction and second directions, each two adjacent first isolation layers arranged in the first direction being spaced apart from each other by a first distance, each first isolation layer being interposed between adjacent photodiodes arranged in the second direction, and a plurality of second isolation layers arranged at regular intervals in the first direction and second directions, each two adjacent second isolation layers arranged in the second direction being spaced apart from each other by a second distance, each second isolation layer being interposed between adjacent photodiodes arranged in the first direction and consecutively arranged. A space between two adjacent first isolation layers arranged in the first direction and a space between two adjacent second isolation layers arranged in the second direction overlap to form a blank region surrounded by the two adjacent first isolation layers and the two adjacent second isolation layers within a substrate including the first isolation layers and the second isolation layers.

In another embodiment of the disclosed technology, an image sensor may include a plurality of photodiodes arranged in a matrix shape, a plurality of first isolation layers arranged at regular intervals in the first direction and second directions, each two adjacent first isolation layers arranged in the first direction being spaced apart from each other by a first distance, each first isolation layer being interposed between adjacent photodiodes arranged in the second direction, and a plurality of second isolation layers arranged at regular intervals in the first direction and second directions, each two adjacent second isolation layers arranged in the second direction being spaced apart from each other by a second distance each second isolation layer being interposed between adjacent photodiodes arranged in the first direction. A blank region is formed at a region surrounded by four adjacent photodiodes within a substrate including the first isolation layers and the second isolation layers.

In another embodiment of the disclosed technology, an image sensor may include a plurality of deep photodiodes (DPDs) arranged in a matrix shape, a plurality of first deep photodiode (DPD) isolation layers spaced apart from each other by a first distance in a first direction while being interposed between the DPDs contiguous to each other and consecutively arranged, and a second DPD isolation layers spaced apart from each other by a second distance in a second direction while being interposed between the DPDs contiguous to each other and consecutively arranged. In a substrate including the first DPD isolation layers and the second DPD isolation layers, a blank region may be disposed at a region in which a first region interposed between the first DPD isolation layers contiguous to each other overlaps a second region interposed between the second DPD isolation layers contiguous to each other.

In another embodiment of the disclosed technology an image sensor may include a plurality of deep photodiodes (DPDs) arranged in a (2×2) matrix shape, a plurality of first deep photodiode (DPD) isolation layers spaced apart from each other by a first distance in a first direction while being interposed between the DPDs contiguous to each other and consecutively arranged, and a second DPD isolation layers spaced apart from each other by a second distance in a second direction while being interposed between the DPDs contiguous to each other and consecutively arranged. A blank region may be disposed at a region corresponding to a center portion surrounded by the plurality of DPDs within a substrate including the first DPD isolation layers and the second DPD isolation layers.

It is to be understood that the foregoing general description, the accompanying drawings, and the following detailed description in this patent document are illustrative and explanatory of technical features and implementations of the disclosed technology.

DETAILED DESCRIPTION

Figure 1:
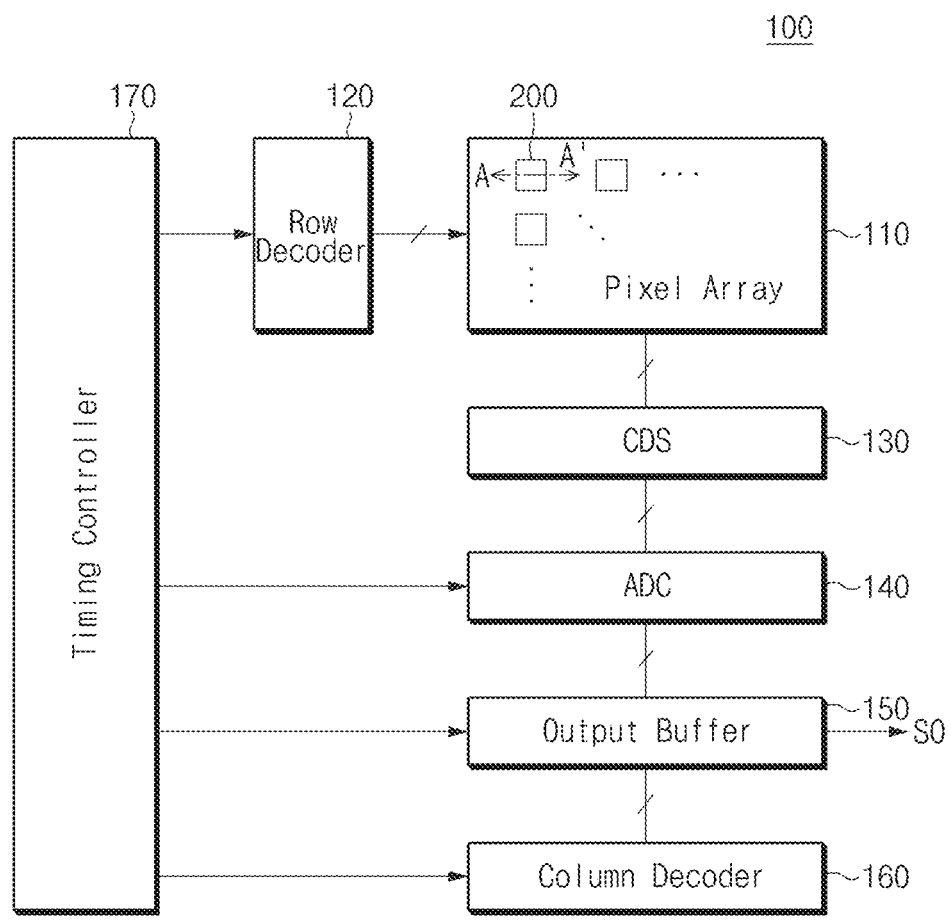
FIG. 1 is a block diagram illustrating an example of an image sensor based on some implementations of the disclosed technology.

This patent document provides implementations and examples of an image sensor that can improve the stability of the patterning for forming photodiodes, transistors, interconnects and other material layers, thereby minimizing defects and variability in the fabrication process.

Reference will now be made in detail to the embodiments of the disclosed technology, examples of which are illustrated in the accompanying drawings. Wherever possible, the same reference numbers will be used throughout the drawings to refer to the same or like parts. While the disclosure is susceptible to various modifications and alternative forms, specific embodiments thereof are shown by way of example in the drawings. However, the disclosure should not be construed as being limited to the embodiments set forth herein, but on the contrary, the disclosure is intended to cover all modifications, equivalents, and alternatives falling within the spirit and scope of the embodiments. In the drawings, the sizes and shapes of elements may be exaggerated for convenience and clarity of description.

FIG. 1 is a block diagram illustrating an example of an image sensor 100 based on some implementations of the disclosed technology.

In some implementations, the image sensor 100 acting as a complementary metal oxide semiconductor (CMOS) image sensor may include a pixel array 110, a row decoder 120, a correlated double sampling (CDS) circuit 130, an analog-to-digital converter (ADC) 140, an output buffer 150, a column decoder 160, and a timing controller 170. In this case, the above-mentioned constituent elements of the image sensor 100 are merely examples, and at least some constituent elements from among the constituent elements may be added to or omitted from the image sensor 100 as necessary.

The pixel array 110 may include a plurality of unit pixels 200 arranged in rows and columns in different row and column directions (e.g., orthogonal to each other) in a two-dimensional (2D) array. The plurality of unit pixels may be arranged such that at least two unit pixels share at least one element. For example, the plurality of unit pixels may be arranged in a shared pixel structure in which at least one element is shared by two or more unit pixels to convert an optical signal or incident light into an electrical signal. In some implementations, each unit pixel or each shared pixel may include more than one transistor along with a photodiode. For example, each unit pixel or each shared pixel may correspond to a 3T pixel (3 transistors per pixel), a 4T pixel (4 transistors per pixel), or a 5T pixel (5 transistors per pixel), or may include more than 5 transistors per cell. The pixel array 110 may receive a control signal such as a row selection signal, a pixel reset signal, and a transmission (Tx) signal from the row decoder 120, and may be operated based on the control signal received from the row decoder 120.

The row decoder 120 may be used to select desired rows of the pixel array 110 based on control signals generated by the timing controller 170. In some implementations, in selecting rows from the pixel array 110. The row decoder 120 may generate a row selection signal to select at least one of a plurality of rows. The row decoder 120 may sequentially enable a pixel reset signal for resetting pixels corresponding to at least one selected row, and a transmission (Tx) signal for the selected pixels to transmit electrical signals generated by the pixels. In this way, an analog-type reference signal and an image signal that are generated from each pixel of the selected row may be sequentially transmitted to the CDS circuit 130. In this regard, the reference signal and the image signal may be collectively called a pixel signal as necessary.

CMOS image sensors may use the correlated double sampling (CDS) to remove an undesired offset value of pixels by sampling a pixel signal twice to remove the difference between these two samples. In one example, the correlated double sampling (CDS) may remove the undesired offset value of pixels by comparing pixel output voltages obtained before and after a light signal is incident on the pixels so that only pixel output voltages based on the incident light can be measured. In some embodiments of the disclosed technology, the CDS circuit 130 may sequentially sample and hold the reference signal and the image signal that are transferred from the pixel array 110 to each of the plurality of column lines. That is, the CDS circuit 130 may sample and hold voltage levels of the reference signal and the image signal corresponding to each column of the pixel array 110.

The CDS circuit 130 may transmit a correlated double sampling (CDS) signal corresponding to the reference signal and the image signal for each column to the ADC 140 upon receiving a control signal from the timing controller 170.

The ADC 140 is used to convert analog CDS signals to digital signals. Examples of the ADC 140 may include a ramp-compare type ADC where the analog pixel signal is compared with a reference signal such as a ramp signal that ramps up or down and a timer counts until a voltage of the ramp signal matches the analog pixel signal. In some embodiments of the disclosed technology, the ADC 140 may receive the CDS signal for each column from the CDS circuit 130, may convert the received CDS signal into a digital signal, and may thus output the digital signal. In some implementations, the ADC 400 samples an input signal (e.g., pixel signal) multiple times using the reference signal and analog-to-digital convert the sampled input signals by counting the number of clock pulses until crossing points. The ADC 140 may perform such counting and calculation operations based on the CDS signal for each column and a ramp signal received from the timing controller 170, such that the ADC 140 may generate digital image data from which noise (e.g., unique reset noise for each pixel) corresponding to each column is removed.

The ADC 140 may include a plurality of column counters corresponding to respective columns of the pixel array 110, and may convert the CDS signal for each column into a digital signal using the column counters, resulting in formation of image data. In another embodiment, the ADC 140 may include a single global counter, and may convert a CDS signal corresponding to each column into a digital signal using a global code received from the global counter.

The output buffer 150 may receive image data for each column received from the ADC 140. In addition, the output buffer 150 may capture the received image data and output the captured image data. The output buffer 150 may temporarily store image data that is output from the ADC 140 upon receiving a control signal from the timing controller 170. The output buffer 150 may operate as an interface configured to compensate for data rate difference or transmission (Tx) speed difference between the image sensor 100 and another device coupled to the image sensor 100.

The column decoder 160 may select a column of the output buffer 150 upon receiving a control signal from the timing controller 170, and may make the output buffer 150 sequentially output the temporarily stored image data. In some implementations, the column decoder 160 may receive an address signal from the timing controller 170, may generate a column selection signal based on the received address signal, and may select a column of the output buffer 150 to output image data from the selected column of the output buffer 150 as an output signal S0.

The timing controller 170 may control the row decoder 120, the ADC 140, the output buffer 150, and the column decoder 160.

The timing controller 170 may transmit a clock signal for operating or synchronizing the constituent elements of the image sensor 100, a control signal for timing control, and address signals for selection of a row or column to the row decoder 120, the column decoder 160, the ADC 140, and the output buffer 150. In some implementations, the timing controller 170 may include a logic control circuit, a phase locked loop (PLL) circuit, a timing control circuit, a communication interface circuit, etc.

Figure 2:
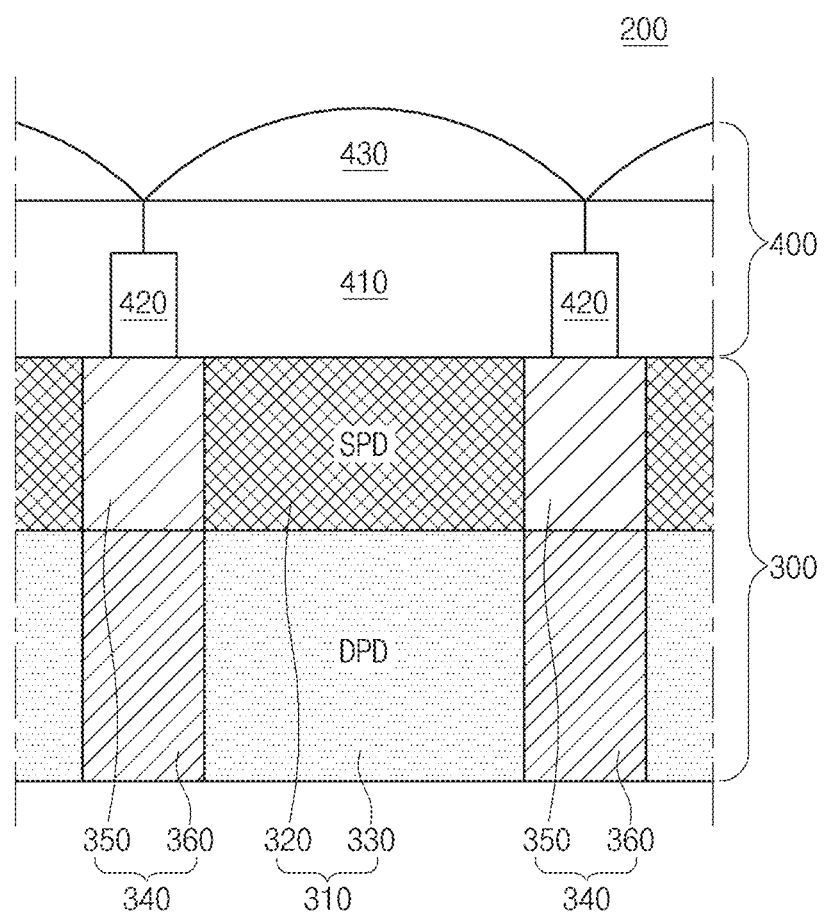
FIG. 2 is a cross-sectional view illustrating an example of a unit pixel taken along line A-A' shown in FIG. 1.

FIG. 2 is a cross-sectional view illustrating an example of a unit pixel 200 taken along line A-A' in the pixel array 110 shown in FIG. 1.

In some implementations, the unit pixel 200 may refer to an arbitrary unit pixel in the pixel array 110. Although the line A-A' is illustrated as extending in a row direction of the pixel array 110 by way of example, the line A-A' may also be in a column direction of the pixel array 110.

In some implementations, the unit pixel 200 may include a substrate region 300 and a light incidence region 400.

The substrate region 300 may include one or more photodiodes 310 and one or more isolation layers 340 structured to electrically (and/or optically) isolate the one or more photodiodes 310 from adjacent photodiodes 310. Although each of the photodiode 310 and the isolation layer 340 are depicted using straight lines in FIG. 2, it should be noted that the photodiode 310 and the isolation layer 340 are formed by ion implantation (See FIG. 11A), and thus each of the photodiode 310 and the isolation layer 340 may have a curved shape.

For example, the substrate region 300 may include a doped region, which may be formed by implanting impurity ions corresponding to n-type region or p-type region of the photodiode 310 and the isolation layer 340. In one example, the substrate region 300 doped with impurity ions may include a P-type or N-type bulk substrate, a P-type bulk substrate, in which a P-type or N-type epitaxial layer is grown, or an N-type bulk substrate, in which a P-type or N-type epitaxial layer is grown.

The photodiode 310 may generate and accumulate photocharges in response to received incident light. In some implementations, the photodiode 310 may be formed as an N-type doped region through ion implantation of N-type ions. The photodiode 310 may be formed by stacking a plurality of doped regions on top of one another. That is, as shown in FIG. 2, the photodiode 310 may include a shallow photodiode (SPD) 320 formed at upper area of the substrate region 300, and a deep photodiode (DPD) 330 formed at bottom area of the substrate region 300. Therefore, the SPD 320 and the DPD 330 may form one photodiode 310. The SPD 320 and the DPD 330 are doped with the same conductivity type to generate and accumulate photocharges according to an intensity of incident light, respectively. In addition, the SPD 320 and the DPD 330 are stacked vertically to increase a photoelectric conversion efficiency, which indicates an efficiency at which the incident light is converted into the photocharges. The SPD 320 and the DPD 330 have a potential gradient so that the photocharge accumulated in the SPD 320 and the DPD 330 can be easily transferred to a floating diffusion node for converting an amount of the photocharges into an electrical signal. That is, the SPD 320 and the DPD 330 may have different doping concentrations from each other. In some implementations, the DPD 330 may be formed by implantation of $N^+$ ions, and the SPD 320 may be formed by implantation of $N^-$ ions. In other implementations, the SPD 320 and the DPD 330 may also be formed with the same doping density.

The isolation layer 340 may be formed to deeply extend in a vertical direction in a manner that the photodiodes 310 of contiguous pixels can be electrically and optically isolated from each other. The isolation layer 340 may include an SPD isolation layer 350 interposed between contiguous SPDs 320 to isolate the SPDs 320 from adjacent SPDs 320, and a DPD isolation layer 360 interposed between contiguous DPDs 330 to isolate the DPDs 330 from adjacent DPDs 330. Therefore, the SPD isolation layer 350 is formed over the DPD isolation layer 360. Although each of the SPD isolation layer 350 and the DPD isolation layer 360 is described as a P-type doped region through implantation of $P^+$ ions, the SPD isolation layer 350 and the DPD isolation layer 360 may be N-type doped region.

In some implementations, the light incidence region 400 may be formed over the substrate region 300, and incident light received from outside may penetrate the light incidence region 400 before arriving at the photodiode 310 after passing through a main lens (not shown). The light incidence region 400 may include a color filter 410, a grid 420, and a microlens 430.

The color filter 410 may be formed over the substrate region 300. The color filter 410 may selectively transmit light rays at a certain wavelength (e.g., light rays at red color wavelengths, light rays at green color wavelengths, light rays at blue color wavelengths, light rays at magenta color wavelengths, light rays at yellow color wavelengths, light rays at cyan color wavelengths) while blocking light at other wavelengths. In some implementations, the unit pixel 200 including a depth pixel may be formed without the color filter 410, or may be formed with an infrared (IR) filter. In some implementations, an anti-reflection film (not shown) may be disposed between the color filter 410 and the substrate region 300.

The grid 420 may be disposed between the contiguous color filters 410 to prevent optical crosstalk by which incident light having penetrated the color filter 410 enters another unit pixel. The grid 420 may include a material (e.g., tungsten) having a high light absorption rate, or may include a material (e.g., a silicon insulation layer, air, etc.) having a relatively lower refractive index than the color filter 410.

The microlens 430 may be formed over the color filter 410, and may increase light gathering power of incident light, resulting in increased light reception (Rx) efficiency of the photodiode 310. In some implementations, an overcoating layer (not shown) may also be formed to prevent diffused reflection of incident light received from outside, thereby suppressing flare characteristics.

Figure 3:
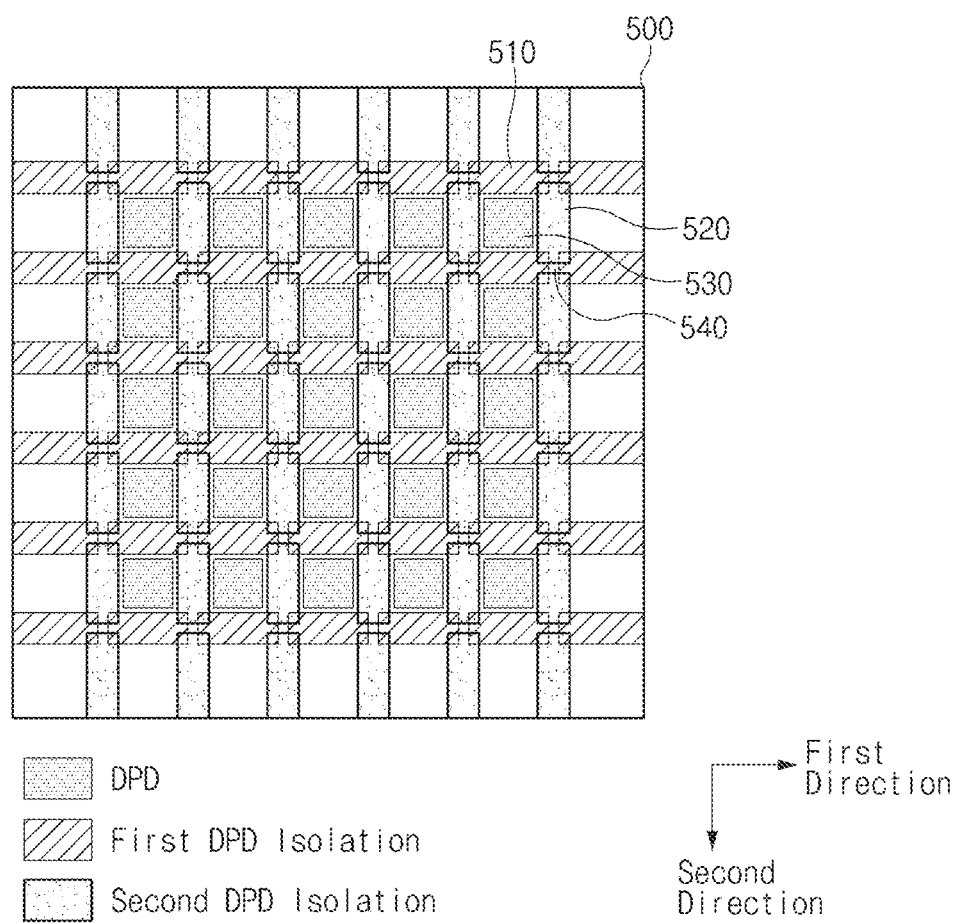
FIG. 3 is a layout diagram illustrating an example of a pixel array based on an embodiment of the disclosed technology.

FIG. 3 is a layout diagram illustrating an example of a pixel array 500 based on an embodiment of the disclosed technology.

In an example illustrated in FIG. 3, by way of example, a pixel array 500 includes unit pixels arranged in a (5x5) matrix.

The pixel array 500 shown in FIG. 3 may include a layout that includes a first DPD isolation layer 510, a second DPD isolation layer 520, and a DPD 530 in each unit pixel.

The first DPD isolation layer 510 and the second DPD isolation layer 520 may correspond to a DPD isolation layer 360 shown in FIG. 2. The DPD 530 may correspond to the DPD 330 shown in FIG. 2.

The DPDs 530 may be spaced apart from each other by a predetermined distance and arranged in a (5x5) matrix in row and column directions of the pixel array 500.

The first DPD isolation layers 510 may be arranged at regular intervals in rows and columns such that each two adjacent first DPD isolation layers 510 are spaced apart from each other by a first distance in a first direction (i.e., in a row direction of the pixel array 500) while being interposed between the DPDs 530 in a second direction. In some implementations, a plurality of first DPD isolation layers 510 may be arranged at regular intervals in a row direction. The first DPD isolation layers 510 may have a horizontal length that is equal to or greater than a horizontal length of the DPDs 530, and may have a vertical length that is equal to or less than a separation distance between the contiguous DPDs 530 arranged in a column direction. Although the first distance is equal to or less than the distance between the contiguous DPDs 530 arranged in a row direction, it should be noted that the first distance can also be greater than the distance between the contiguous DPDs 530 arranged in a row direction.

The second DPD isolation layers 520 may be arranged at regular intervals in rows and columns such that each two adjacent second DPD isolation layers 520 are spaced apart from each other by a second distance in the second direction (i.e., in a column direction of the pixel array 500) while being interposed between the DPDs 530 in the first direction. In some implementations, a plurality of second DPD isolation layers 520 may be arranged at regular intervals in a column direction. Each of the second DPD isolation layers 520 may have a vertical length that is equal to or greater than a vertical length of each DPD 530, and may have a horizontal length that is equal to or less than a separation distance between the contiguous DPDs 530 arranged in a row direction. Although the second distance is equal to or less than the separation distance between the contiguous DPDs 530 arranged in a column direction, it should be noted that the second distance according to another embodiment can also be greater than the separation distance between the contiguous DPDs 530 arranged in a column direction.

In an implementation, the first distance and the second distance may be identical to each other. In another implementation, the first distance and the second distance may be different from each other.

Since the first DPD isolation layers 510 and the second DPD isolation layers 520 are arranged at regular intervals in row and column directions, respectively, a blank region 540 may be disposed at a region in which a first region interposed between the first DPD isolation layers 510 contiguous to each other overlaps a second region interposed between the second DPD isolation layers 520 contiguous to each other. In other words, the blank region 540 may be disposed at the center portion surrounded by four DPDs 530 arranged in a (2x2) matrix, or the blank region 540 may be disposed at an intersection region between a first extension line through which the first DPD isolation layers 510 arranged in the first direction are coupled to each other and a second extension line through which the second DPD isolation layers 520 arranged in the second direction are coupled to each other.

Neither the first DPD isolation layer 510 nor the second DPD isolation layer 520 may be disposed in the blank region 540. In addition, the blank region 540 may have a horizontal length corresponding to the first distance and a vertical length corresponding to the second distance.

Figure 4:
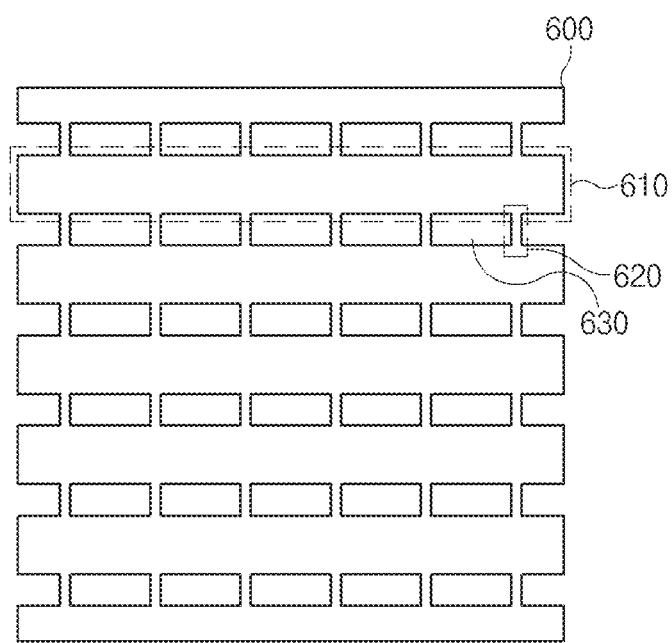
FIG. 4 is a plan view illustrating an example of a first photoresist for forming a first deep photodiode (DPD) isolation layer shown in FIG. 3.

FIG. 4 is a plan view illustrating an example of a first photoresist 600 for forming the first DPD isolation layer 510 shown in FIG. 3.

In some implementations, the first photoresist 600 may be used in the ion implantation process for forming the first DPD isolation layer 510. The first photoresist 600 may be formed of a polymer compound that reacts to light or electron beam.

The first photoresist 600 may include a main pattern 610, a support pattern 620, and an open region 630. The first photoresist 600 may be formed in a ladder shape in which all parts of the first photoresist 600 are connected to each other and are integrated into one structure.

The main pattern 610 may be formed in a straight line extending in the first direction, and the width of the main pattern 610 may be identical to a distance between two adjacent first DPD isolation layers 510 where the first DPD isolation layers 510 are formed at regular intervals in the column direction.

The support pattern 620 may be formed in a specific shape through which the main patterns 610 are coupled to each other. A horizontal length of the support pattern 620 may be identical to the first distance, and a vertical length of the support pattern 620 may be identical or similar to the vertical length of the first DPD isolation layer 510. In some implementations, a distance between two adjacent support patterns 620 where the support patterns 620 are consecutively arranged may be identical or similar to the horizontal length of the first DPD isolation layer 510.

In the context of this patent document, the word "identical" can indicate not only an identical length or distance, but also a similar length or distance.

The open region 630 may be surrounded by a first region interposed between the contiguous main patterns 610 and a second region interposed between the contiguous support patterns 620. During the ion implantation process, ions for forming the first DPD isolation layer 510 may be implanted through the open region 630.

Figure 5:
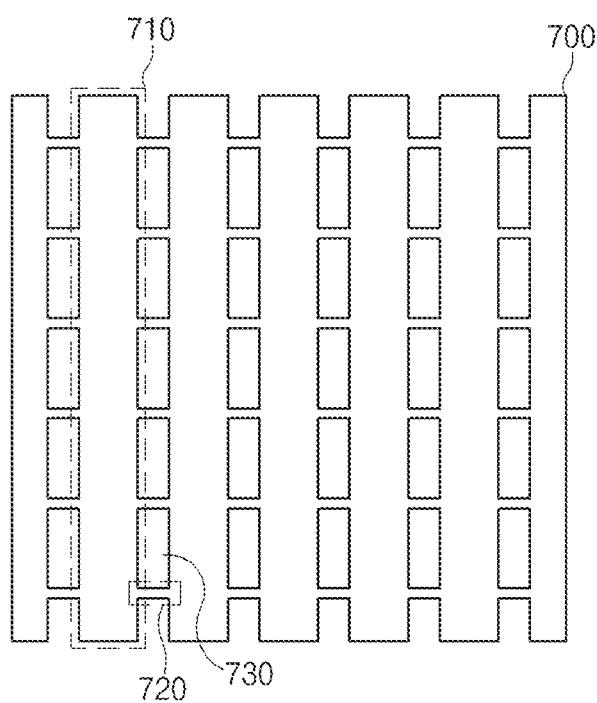
FIG. 5 is a plan view illustrating an example of a second photoresist for forming a second DPD isolation layer shown in FIG. 3.

FIG. 5 is a plan view illustrating an example of a second photoresist 700 for forming the second DPD isolation layer 520 shown in FIG. 3.

In some implementations, the second photoresist 700 may be used in the ion implantation process for forming the second DPD isolation layer 520. The second photoresist 700 may be formed of a polymer compound that reacts to light or electron beam.

The second photoresist 700 may include a main pattern 710, a support pattern 720, and an open region 730. The second photoresist 700 may be formed in a ladder shape in which all parts of the second photoresist 700 are connected to each other and are integrated into one structure.

The main pattern 710 may be formed in a straight line extending in the second direction, and the width of the main pattern 710 may be identical or similar to a distance between two adjacent second DPD isolation layers 520 where the second DPD isolation layers 520 are formed at regular intervals in the row direction.

The support pattern 720 may be formed in a specific shape through which the main patterns 710 contiguous to each other are coupled to each other. A vertical length of the support pattern 720 may be identical or similar to the second distance, and a horizontal length of the support pattern 720 may be identical to the horizontal length of the second DPD isolation layer 520. In some implementations, a separation distance between the contiguous support patterns 720 may be identical or similar to the vertical length of the second DPD isolation layer 520.

The open region 730 may be an open region that is defined not only by a first region interposed between the contiguous main patterns 710, but also by a second region interposed between the contiguous support patterns 720. During the ion implantation process, ions for forming the second DPD isolation layer 520 may be implanted through the open region 730.

Figure 6:
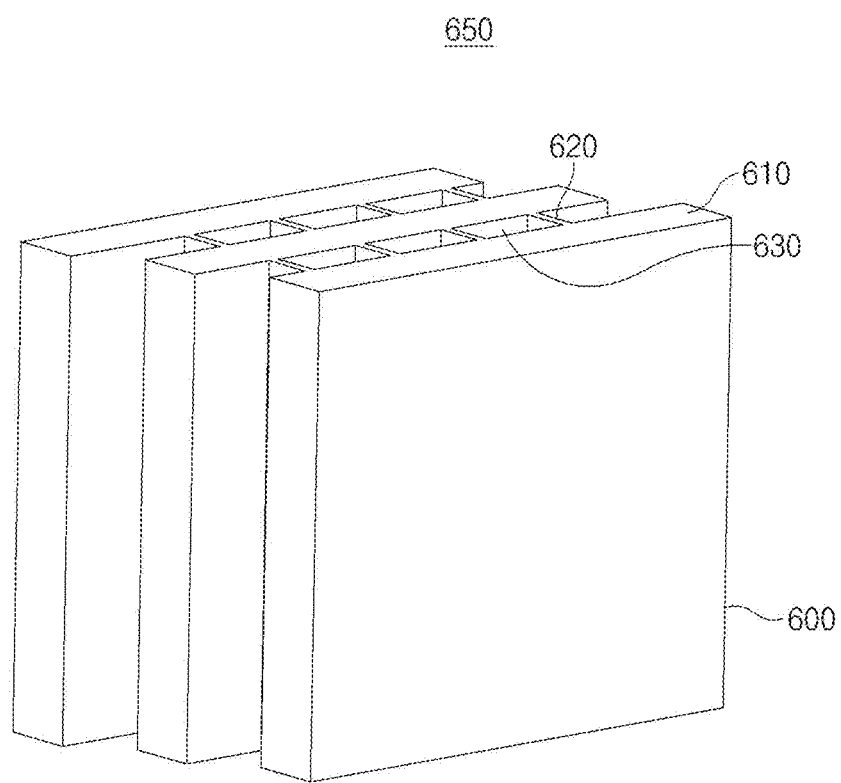
FIG. 6 is a perspective view illustrating an example of the first photoresist shown in FIG. 4.

FIG. 6 is a perspective view illustrating an example of the first photoresist 600 shown in FIG. 4.

In some implementations, the perspective view 650 of the first photoresist 600 shown in FIG. 4 is illustrated. Although only three main patterns 610 are shown in FIG. 6 for convenience of description, it should be noted that the remaining main patterns can also be integrated into one structure through the support patterns.

As can be seen from FIG. 6, the first photoresist 600 may be formed to have a sufficient height that is capable of forming the first DPD isolation layer 510.

The photodiode 310 may be arranged across as large a region as possible to increase a fill factor indicating light reception (Rx) efficiency. However, as the image sensor chip is gradually reduced in size and demand for high-resolution image sensors is rapidly increasing, the region occupied by only one pixel is gradually reduced in size. In addition, in order to increase the fill factor as well as to guarantee volume of the photodiode 310, the DPD 330 may also be formed below the substrate region 300.

However, in order to form the DPD 330 and the DPD isolation layer 360 below the substrate region 300, an ion implantation process requires relatively high energy. In order to avoid damages from the ion implantation process, it is desirable for the photoresist to have a larger thickness.

In order to form a thicker photoresist needed to form the DPD isolation layer 360, a PR slope (i.e., a slope of a photoresist wall to a plane) of the photoresist may increase. Such increase in PR slope may decrease stability of the photoresist, and may cause collapse or tilting of the photoresist, such that the quality of the DPD 330 may be deteriorated as a result of the ion implantation process.

In addition, a thick photoresist having a narrow pattern may deteriorate a critical dimension (CD) dispersion rate (or may deteriorate uniformity of a target CD), and thus the quality of the DPD 330 may be deteriorated as a result of the ion implantation process.

The embodiments of the disclosed technology can be used to implement a dual patterning scheme to form the DPD isolation layer 360. In the dual patterning scheme, after the DPD isolation layer extending in a row direction is formed using a photoresist having elongated patterns extending in the row direction, instead of using a photoresist having a specific region corresponding to each DPD 330, the DPD isolation layer extending in a column direction is formed using a photoresist having elongated patterns extending in the column direction.

However, since each of the elongated patterns has a very small width, the photoresist has low stability, leading to collapse of the photoresist in a lithography process including the ion implantation process. For example, unlike the first photoresist 600, in a lithography process for forming a photoresist that is composed of only the main pattern 610 without using the support pattern 620, the main pattern 610 may easily collapse toward the contiguous main pattern 610 adjacent thereto. Such collapse of the main pattern 610 may cause a serious adverse effect on the quality of the image sensor, and at the same time may decrease a production yield.

However, the first photoresist 600 may include the support patterns 620 that are spaced apart from each other by a predetermined distance and maintain a constant spacing between the main patterns 610, such that the first photoresist 600 can prevent collapse of the main patterns 610. In this case, the width (or a first distance) of each support pattern 620 can be experimentally decided in a manner that the first photoresist 600 can prevent collapse of the main patterns 610 and at the same time can also guarantee functions of the first DPD isolation layers 510.

Although the perspective view of the second photoresist 700 is not shown in the drawings, the second photoresist 700 can be formed in the same way as the first photoresist 600.

The blank region 540 may be formed in the ion implantation process in which the first photoresist 600 and the second photoresist 700 are used. However, if the blank region 540 has a specific size that does not affect the function of physically isolating the contiguous DPDs 530 from each other, the blank region 540 can guarantee the fabrication stability of the semiconductor devices without deteriorating performance of the image sensor.

Figure 7:
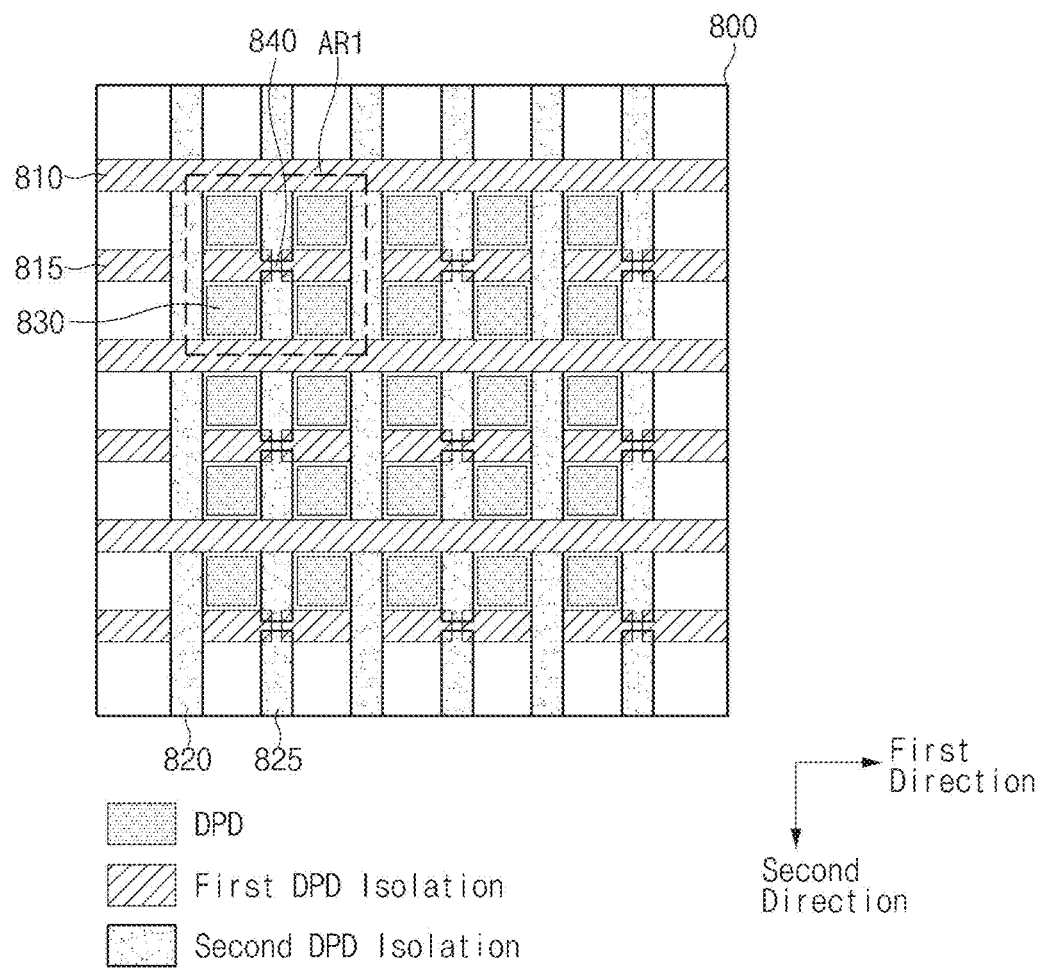
FIG. 7 is a layout diagram illustrating an example of a pixel array based on another embodiment of the disclosed technology.

FIG. 7 is a layout diagram illustrating an example of a pixel array 800 based on another embodiment of the disclosed technology.

In some implementations, the pixel array 800 may include a layout structure in each unit pixel that includes first DPD isolation layers 810 and 815, a second DPD isolation layers 820 and 825, and a DPD 830.

The first DPD isolation layers 810 and 815 and the second DPD isolation layers 820 and 825 may correspond to the DPD isolation layers 360 shown in FIG. 2. The DPDs 830 may correspond to the DPDs 330 shown in FIG. 2.

The DPDs 830 may be spaced apart from each other by a predetermined distance, and may be formed in a (5x5) matrix arranged in row and column directions of the pixel array 800.

The first DPD isolation layers 810 may extend in a first direction (i.e., in a row direction of the pixel array 800) while being interposed between the contiguous DPDs 830, and may be connected to each other to form one structure. That is, each of the first DPD isolation layers 810 may be seen as solid lines connected to each other. Each of the first DPD isolation layers 810 may have a vertical length that is equal to or less than a separation distance between the contiguous DPDs 830 arranged in a column direction. Each of the first DPD isolation layers 810 may also be defined as a third DPD isolation layer in a manner that the first DPD isolation layers 810 can be distinguished from the first DPD isolation layers 815.

The first DPD isolation layers 815 may be spaced apart from each other by a first distance in a first direction while being interposed between the contiguous DPDs 830, and may be consecutively arranged. In some implementations, a plurality of first DPD isolation layers 815 may be arranged at regular intervals in a row direction. Each of the first DPD isolation layers 815 may have a horizontal length that is equal to or greater than a horizontal length of each DPD 830, and may have a vertical length that is equal to or less than a separation distance between the contiguous DPDs 830 arranged in the column direction. Although the first distance may be identical to or less than the separation distance between the contiguous DPDs 830 arranged in the row direction, it should be noted that the first distance according to another embodiment can also be greater than the separation distance between the contiguous DPDs 830 arranged in the row direction.

As can be seen from FIG. 7, a row line corresponding to the first DPD isolation layer 810 and a row line corresponding to the first DPD isolation layers 815 may be alternately arranged in the second direction.

Each of the second DPD isolation layers 820 may extend in the second direction (i.e., in the column direction of the pixel array 800) while being interposed between the contiguous DPDs 830, such that the second DPD isolation layers 820 may be connected to each other to form one structure. That is, each of the second DPD isolation layers 820 may be seen as solid lines connected to each other. Each of the second DPD isolation layers 820 may have a horizontal length that is equal to or less than the separation distance between the contiguous DPDs 830 arranged in the row direction. Each of the second DPD isolation layers 820 may also be defined as a fourth DPD isolation layer in a manner that the second DPD isolation layers 820 can be distinguished from second DPD isolation layers 825.

The second DPD isolation layers 825 may be spaced apart from each other by a second distance in the second direction while being interposed between the contiguous DPDs 830, and may be consecutively arranged. In some implementations, a plurality of second DPD isolation layers 825 may be arranged at regular intervals in a column direction. Each of the second DPD isolation layers 825 may have a vertical length that is equal to or greater than a vertical length of each DPD 830, and may have a horizontal length that is equal to or less than the separation distance between the contiguous DPDs 830 arranged in the row direction. Although the second distance may be identical to or less than the separation distance between the contiguous DPDs 830 arranged in the column direction, it should be noted that the second distance according to another embodiment can also be greater than the separation distance between the contiguous DPDs 830 arranged in the column direction.

As can be seen from FIG. 7, a row line corresponding to the second DPD isolation layers 820 and a row line corresponding to the first DPD isolation layers 825 may be alternately arranged in the first direction.

In this case, the first distance and the second distance may be identical to each other, or may be different from each other.

Since the first DPD isolation layers 815 and the second DPD isolation layers 825 are arranged at regular intervals in row and column directions, respectively, a blank region 840 may be disposed at a region in which a first region interposed between the first DPD isolation layers 815 contiguous to each other overlaps a second region interposed between the second DPD isolation layers 825 contiguous to each other. In other words, in a region where a first region interposed between the first DPD isolation layers 810 overlaps a second region interposed between the second DPD isolation layers 820, the blank region 840 may be disposed at the center portion of a specific region (AR1) composed of four DPDs 830 arranged in a (2x2) matrix, or the blank region 840 may be disposed at an intersection region between a first extension line through which the first DPD isolation layers 815 arranged in the first direction are coupled to each other and a second extension line through which the second DPD isolation layers 825 arranged in the second direction are coupled to each other.

Neither the first DPD isolation layers 810 and 815 nor the second DPD isolation layers 820 and 825 may be disposed in the blank region 840.

In contrast, the blank region may not be formed at the intersection region between the first DPD isolation layer 810 and the extension line through which the second DPD isolation layers 825 are coupled to each other, or may not be formed at the intersection region between the first DPD isolation layer 810 and the second DPD isolation layers 820.

In addition, the blank region may not be formed at the intersection region between the second DPD isolation layer 820 and the extension line through which the first DPD isolation layers 815 are coupled to each other, or may not be formed at the intersection region between the second DPD isolation layer 820 and the first DPD isolation layers 810.

Figure 8:
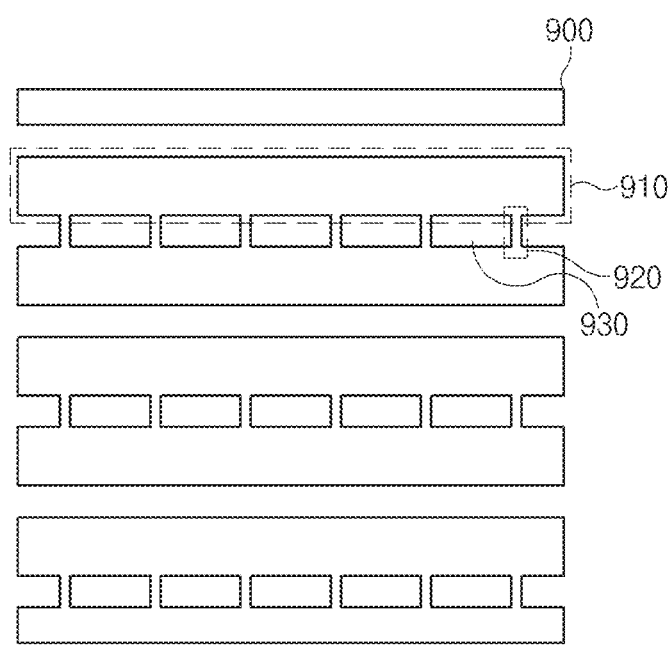
FIG. 8 is a plan view illustrating an example of a first photoresist for forming first DPD isolation layers shown in FIG. 7.

FIG. 8 is a plan view illustrating an example of a first photoresist 900 for forming the first DPD isolation layers 810 and 815 shown in FIG. 7.

In some implementations, the first photoresist 900 may be used in the ion implantation process for forming the first DPD isolation layers 810 and 815. The first photoresist 900 may be formed of a polymer compound that reacts to light or electron beam.

The first photoresist 900 may include a main pattern 910, a support pattern 920, and an open region 930. Differently from FIG. 4, the first photoresist 900 shown in FIG. 8 may be formed in a ladder shape that is isolated per two main patterns 910.

The main pattern 910 may be formed in a straight line extending in the first direction, and the width of the main pattern 910 may be identical to a distance between two adjacent first DPD isolation layers 810 and 815 where the first DPD isolation layers 810 and 815 are formed at regular intervals in the column direction.

The support pattern 920 may be formed in a specific shape through which the main patterns 910 contiguous to each other are coupled to each other. A horizontal length of the support pattern 920 may be identical to the first distance, and a vertical length of the support pattern 920 may be identical to the vertical length of the first DPD isolation layer 815. In some implementations, a distance between the contiguous support patterns 920 may be identical or similar to the horizontal length of the first DPD isolation layer 815.

The open region 930 may be surrounded by a first region interposed between the contiguous main patterns 910 and a second region interposed between the contiguous support patterns 920. During the ion implantation process, ions for forming the first DPD isolation layer 815 may be implanted through the open region 930.

In addition, as described above, the first photoresist 900 may be formed in a ladder shape (two main patterns 910 connected by multiple connection patterns 920) that is isolated from adjacent ladder shaped photoresist patterns. Here, a distance between the first photoresists 900 that are isolated from each other and are adjacent to each other may be identical or similar to a vertical length (i.e., width) of the first DPD isolation layer 810.

Figure 9:
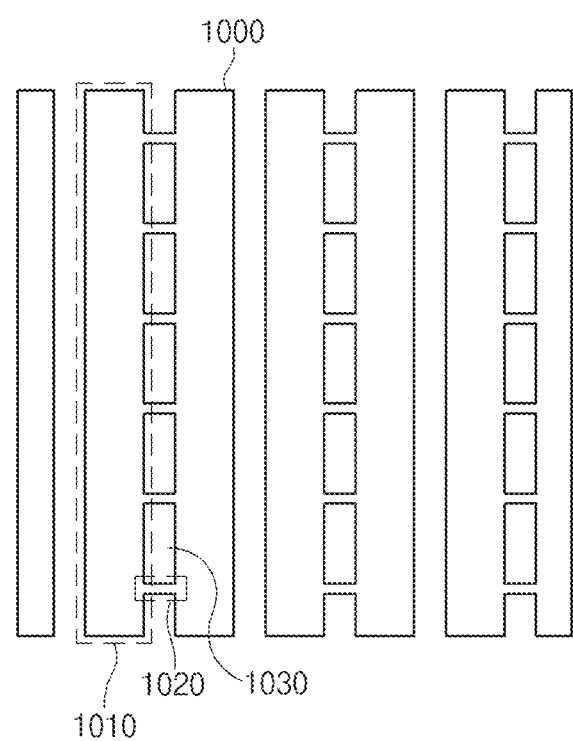
FIG. 9 is a plan view illustrating an example of a second photoresist for forming second DPD isolation layers shown in FIG. 7.

FIG. 9 is a plan view illustrating an example of a second photoresist 1000 for forming the second DPD isolation layers 820 and 825 shown in FIG. 7.

In some implementations, the second photoresist 1000 may be used in the ion implantation process for forming the second DPD isolation layers 820 and 825. The second photoresist 1000 may be formed of a polymer compound that reacts to light or electron beam.

The second photoresist 1000 may include a main pattern 1010, a support pattern 1020, and an open region 1030. Differently from FIG. 5, the second photoresist 1000 shown in FIG. 9 may be formed in a ladder shape that is isolated per two main patterns 1010.

The main pattern 1010 may be formed in a straight line extending in the second direction, and the width of the main pattern 1010 may be identical to a distance between two adjacent second DPD isolation layers 820 and 825 where the second DPD isolation layers 820 and 825 are formed at regular intervals in the row direction.

The support pattern 1020 may be formed in a specific shape through which the main patterns 1010 contiguous to each other are coupled to each other. A vertical length of the support pattern 1020 may be identical to the second distance, and a horizontal length of the support pattern 1020 may be identical or similar to the horizontal length of the second DPD isolation layer 825. In some implementations, a separation distance between the contiguous support patterns 1020 may be identical or similar to the vertical length of the second DPD isolation layer 825.

The open region 1030 may be surrounded by a first region interposed between the contiguous main patterns 1010 and a second region interposed between the contiguous support patterns 1020. During the ion implantation process, ions for forming the second DPD isolation layer 825 may be implanted through the open region 1030.

In addition, as described above, the second photoresist 1000 may be formed in a ladder shape (two main patterns 1010 connected by multiple connection patterns 1020) that is isolated per two main patterns 1010. Here, a distance between the second photoresists 1000 that are isolated from each other and are contiguous to each other may be identical to a horizontal length (i.e., width) of the second DPD isolation layer 820.

Figure 10:
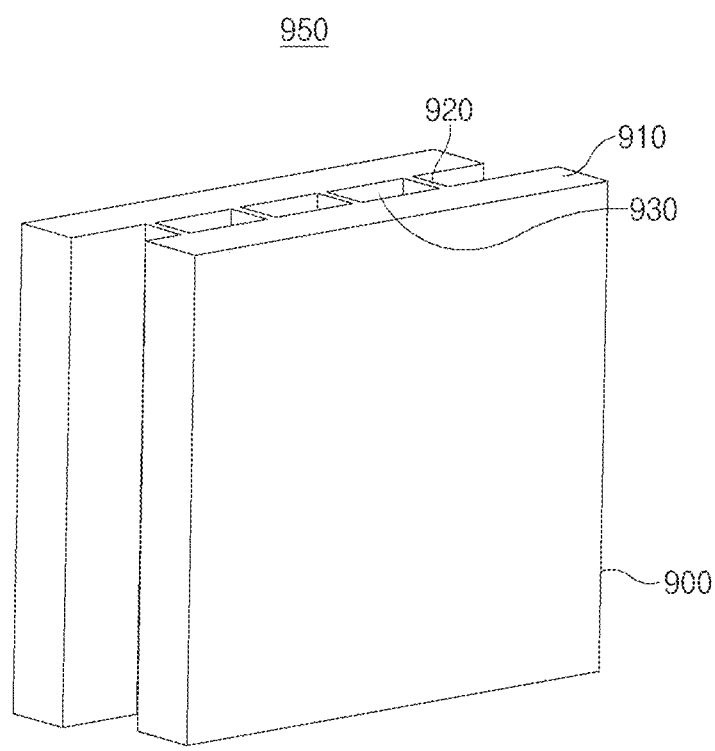
FIG. 10 is a perspective view illustrating an example of the first photoresist shown in FIG. 8.

FIG. 10 is a perspective view illustrating an example of the first photoresist 900 shown in FIG. 8.

Referring to FIG. 10, the perspective view 950 of the first photoresist 900 shown in FIG. 8 is illustrated.

As can be seen from FIG. 10, the first photoresist 900 may be formed to have a sufficient height that is capable of forming the first DPD isolation layers 810 and 815.

The first photoresist 900 may include the support patterns 920 that are spaced apart from each other by a predetermined distance and maintain a constant spacing between the contiguous main patterns 910, such that the first photoresist 900 can prevent collapse of the main patterns 910. In this case, the width (or a first distance) of each support pattern 920 may be experimentally decided in a manner that the first photoresist 900 can prevent collapse of the main patterns 910 and at the same time can also guarantee functions of the first DPD isolation layers 815. Although the support patterns 920 are not disposed at both sides of each main pattern 910, the support patterns 920 can provide much higher stability in shape than the other case in which the support patters 920 are not used.

That is, line-shaped patterning based on four photodiodes 830 may be carried out at outer walls of the four photodiodes 830, and dotted-line-shaped patterning may be carried out at the isolation layers among the four photodiodes 830, such that dispersion of characteristics of 4-shared pixels can be minimized and at the same time shape stability of a narrow photoresist can also be guaranteed.

Although the perspective view of the second photoresist 1000 is not shown in the drawings, it should be noted that technical ideas described in the first photoresist 900 can also be substantially identical to those of the second photoresist 1000.

The blank region 840 may be formed in the ion implantation process in which the first photoresist 900 and the second photoresist 1000 are used. However, if the blank region 840 has a specific size that does not affect the function of physically isolating the contiguous DPDs 830 from each other, the blank region 840 can guarantee the fabrication stability of the semiconductor devices without deteriorating performance of the image sensor.

A fabrication process for forming the image sensor 100 according to one embodiment of the disclosed technology will hereinafter be described. Although only a fabrication process for forming the pixel array 500 shown in FIG. 3 will hereinafter be described with reference to the attached drawings for convenience of description, the scope or spirit of the disclosed technology is not limited thereto, and it should be noted that the remaining parts other than types of photoresists to be used in the fabrication process for forming the pixel array 800 shown in FIG. 7 are substantially identical to those of FIG. 3.

Figure 11A:
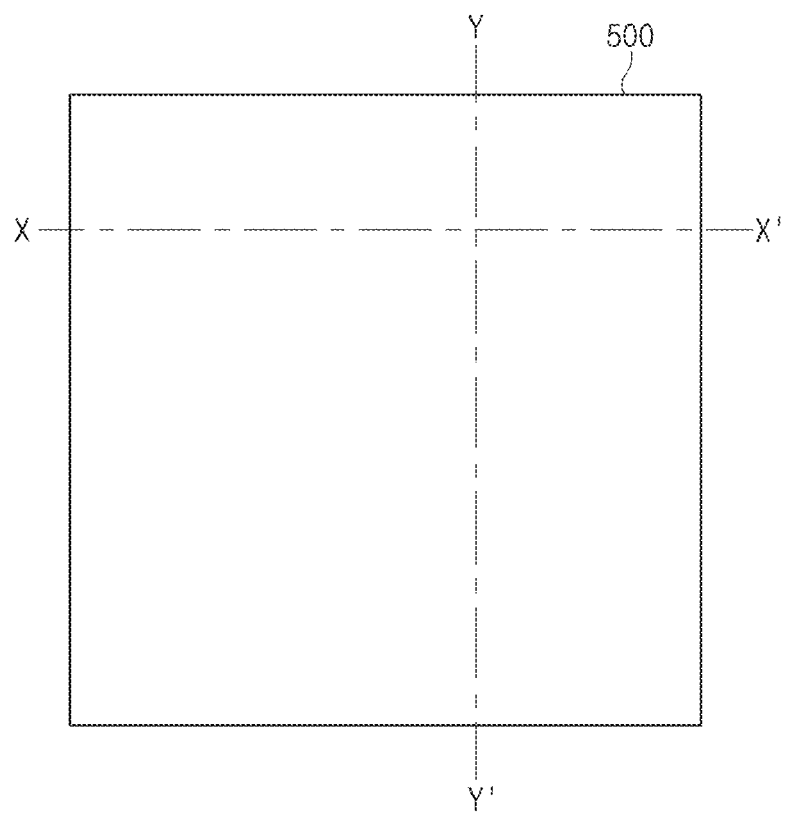
FIG. 11A is a layout diagram illustrating an example of a pixel array that can be used in a first fabrication process based on some implementations of the disclosed technology.
Figure 11B:
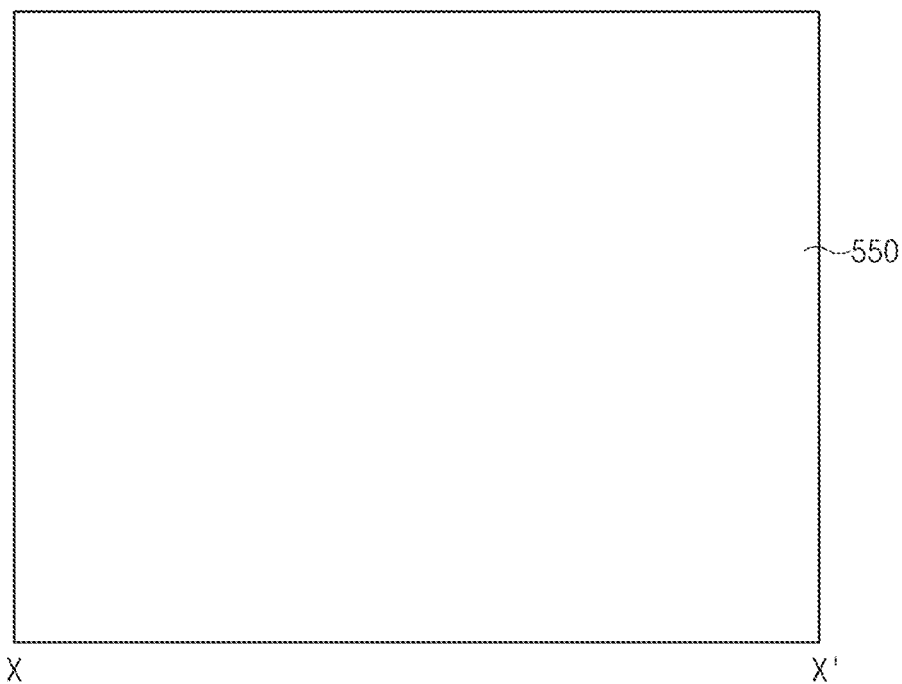
FIG. 11B is a cross-sectional view illustrating an example of the pixel array taken along a first cutting line shown in FIG. 11A based on some implementations of the disclosed technology.
Figure 11C:
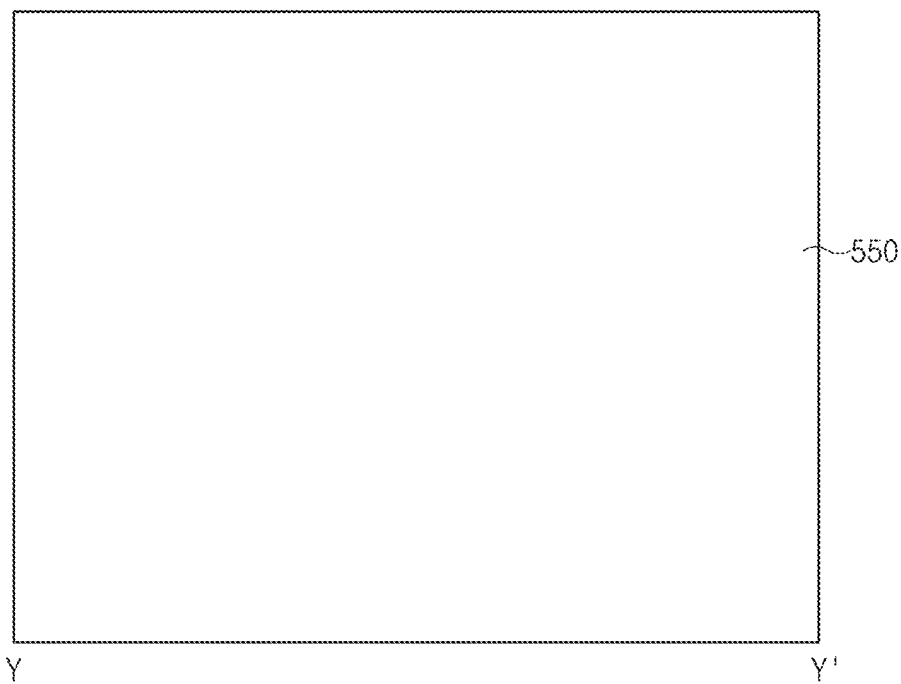
FIG. 11C is a cross-sectional view illustrating an example of the pixel array taken along a second cutting line shown in FIG. 11A based on some implementations of the disclosed technology.

FIG. 11A is a layout diagram illustrating an example of the pixel array 500 that can be used in a first fabrication process. FIG. 11B is a cross-sectional view illustrating an example of the pixel array 500 taken along a first cutting line X-X' shown in FIG. 11A. FIG. 11C is a cross-sectional view illustrating an example of the pixel array 500 taken along a second cutting line Y-Y' shown in FIG. 11A.

Referring to FIG. 11A, a substrate 550 may be disposed over the pixel array 500 in a first fabrication process.

Referring to FIG. 11B, a cross-sectional view of the pixel array 500 taken along the first cutting line X-X' is illustrated. Only the substrate 550 may be contained in the cross-sectional view shown in FIG. 11B.

Referring to FIG. 11C, a cross-sectional view of the pixel array 500 taken along the second cutting line Y-Y' is illustrated. Likewise, only the substrate 550 may be contained in the cross-sectional view shown in FIG. 11C.

Figure 12A:
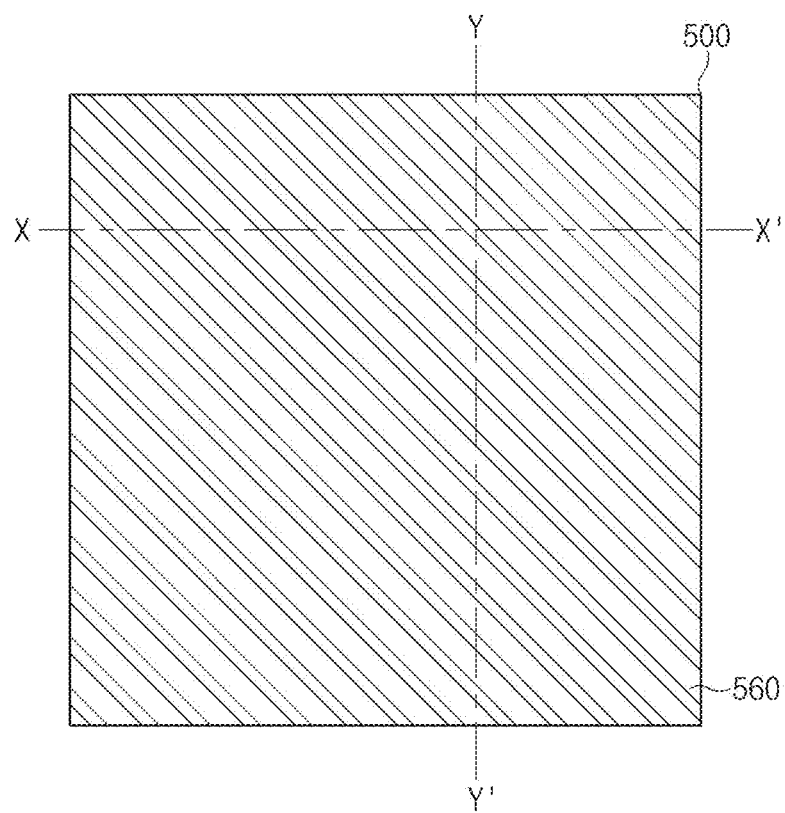
FIG. 12A is a layout diagram illustrating an example of a pixel array that can be used in a second fabrication process based on some implementations of the disclosed technology.
Figure 12B:
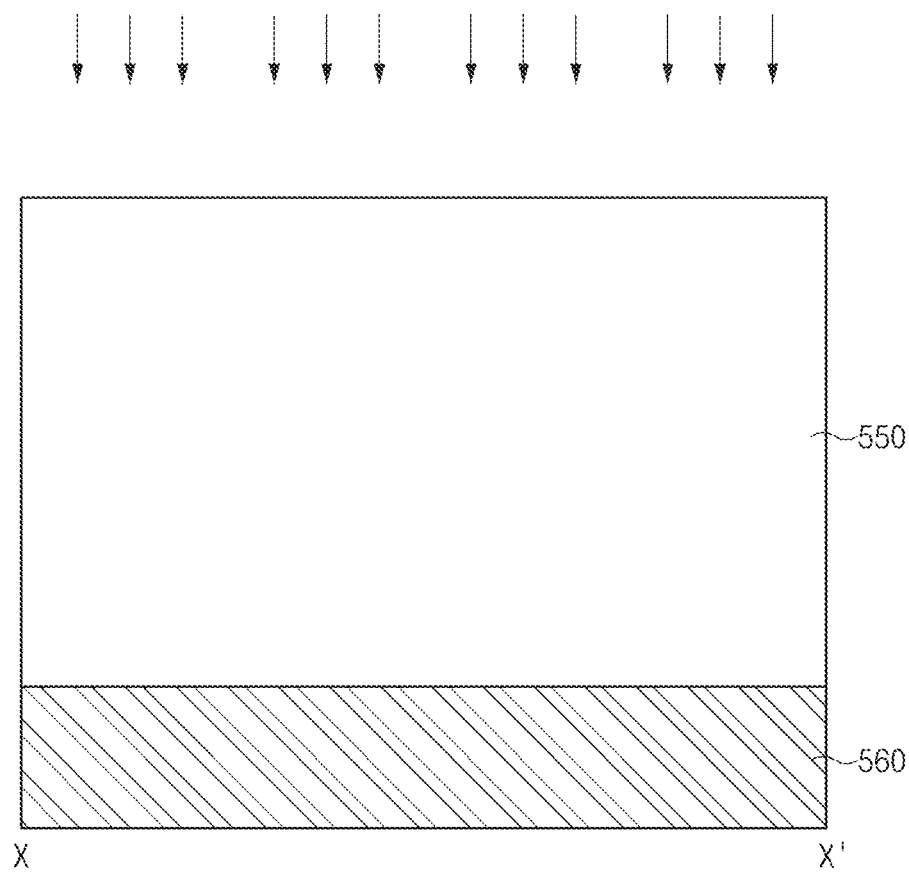
FIG. 12B is a cross-sectional view illustrating an example of the pixel array taken along a first cutting line shown in FIG. 12A based on some implementations of the disclosed technology.
Figure 12C:
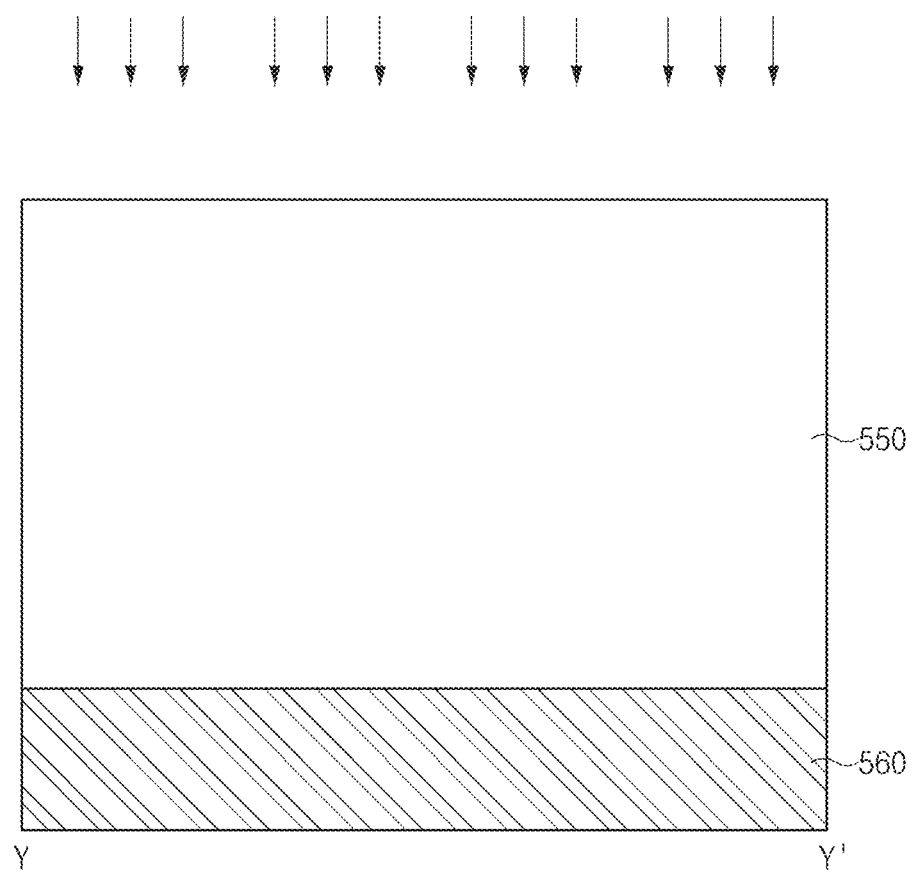
FIG. 12C is a cross-sectional view illustrating an example of the pixel array taken along a second cutting line shown in FIG. 12A based on some implementations of the disclosed technology.

FIG. 12A is a layout diagram illustrating an example of the pixel array 500 that can be used in a second fabrication process. FIG. 12B is a cross-sectional view illustrating an example of the pixel array 500 taken along a first cutting line X-X' shown in FIG. 12A. FIG. 12C is a cross-sectional view illustrating an example of the pixel array 500 taken along a second cutting line Y-Y' shown in FIG. 12A.

Referring to FIG. 12A, the pixel array 500 formed for the second fabrication process may include an impurity layer 560 that is formed below the substrate 550 by an ion implantation process based on a bottom blanket scheme. In this case, the bottom-blanket based ion implantation process may refer to an ion implantation process for allowing impurities to be implanted into the bottom part of the substrate 550. Although the impurity layer 560 is formed of P-type impurities, the scope or spirit of the disclosed technology is not limited thereto. Although the impurity layer is not shown in FIG. 2, it should be noted that another impurity layer may be formed below the photodiode 310 and the isolation layer 340.

Referring to FIG. 12B, the cross-sectional view of the pixel array 500 taken along the first cutting line X-X' is illustrated. The impurity layer 560 may be formed to a predetermined distance at a lower part of the substrate 550.

Referring to FIG. 12C, the cross-sectional view of the pixel array 500 taken along the second cutting line Y-Y' is illustrated. Likewise, the impurity layer 560 may be formed to a predetermined thickness at a lower part of the substrate 550.

Figure 13A:
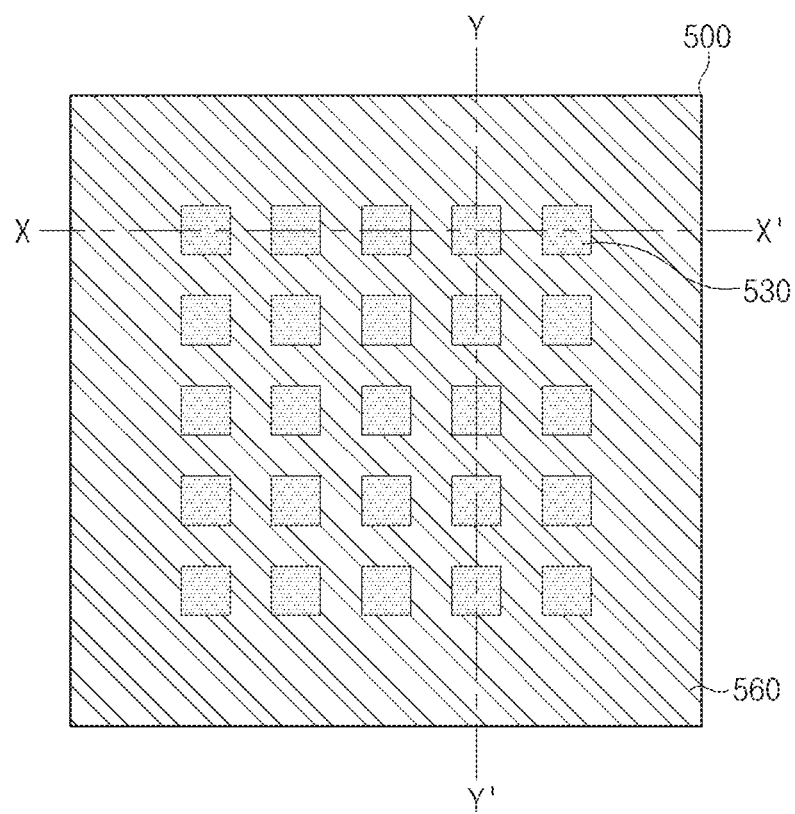
FIG. 13A is a layout diagram illustrating an example of a pixel array that can be used in a third fabrication process based on some implementations of the disclosed technology.
Figure 13B:
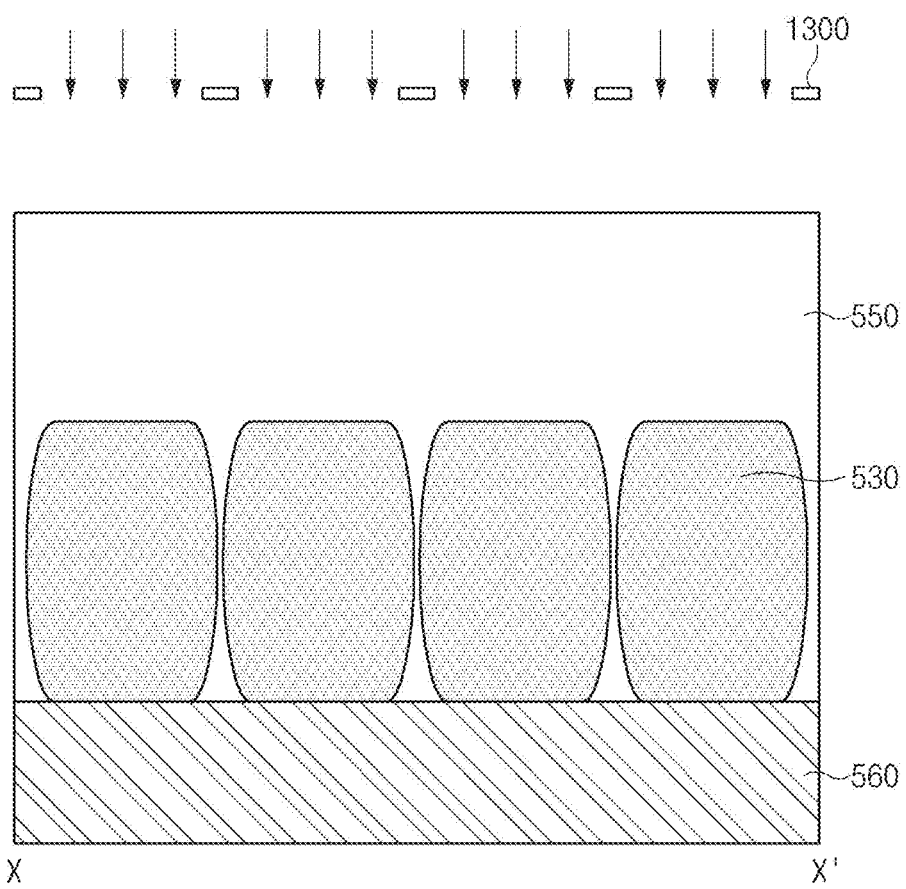
FIG. 13B is a cross-sectional view illustrating an example of the pixel array taken along a first cutting line shown in FIG. 13A based on some implementations of the disclosed technology.
Figure 13C:
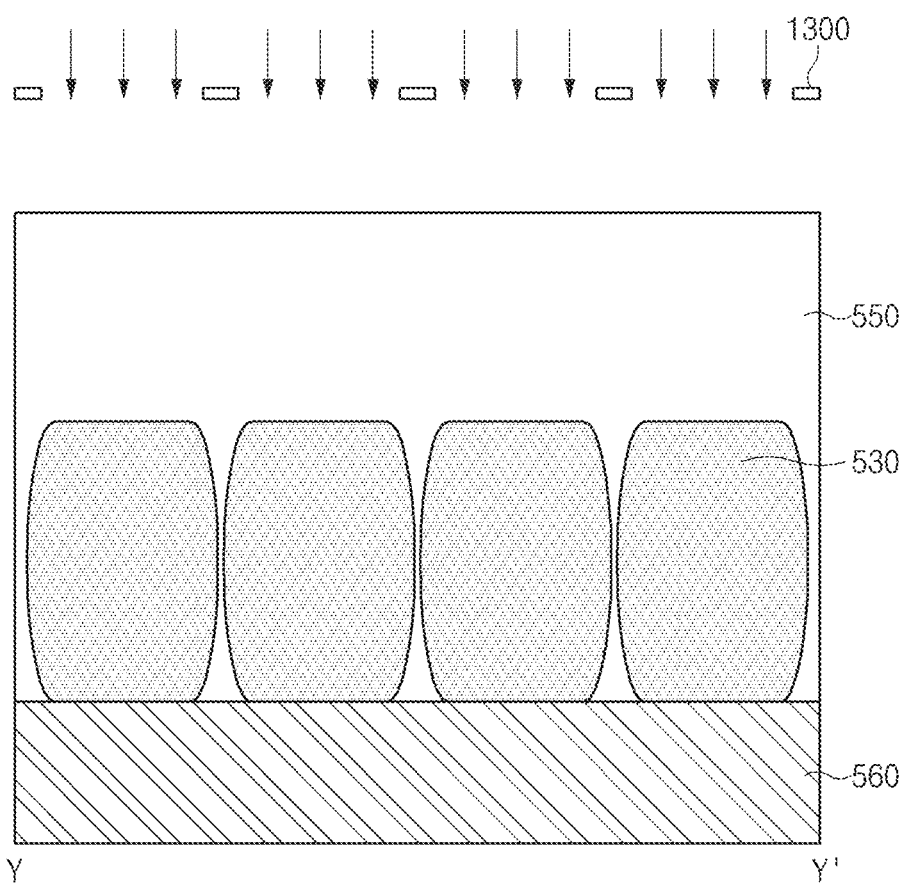
FIG. 13C is a cross-sectional view illustrating an example of the pixel array taken along a second cutting line shown in FIG. 13A based on some implementations of the disclosed technology.

FIG. 13A is a layout diagram illustrating an example of the pixel array 500 that can be used in a third fabrication process. FIG. 13B is a cross-sectional view illustrating an example of the pixel array 500 taken along a first cutting line X-X' shown in FIG. 13A. FIG. 13C is a cross-sectional view illustrating an example of the pixel array 500 taken along a second cutting line Y-Y' shown in FIG. 13A.

Referring to FIG. 13A, the DPDs 530 may be spaced apart from each other by a predetermined distance at preset positions, so that the DPDs 530 may be formed in a matrix shape.

Referring to FIG. 13B, the cross-sectional view of the pixel array 500 taken along the first cutting line X-X' shown in FIG. 13A is illustrated. The ion implantation process may be carried out using the photoresist pattern 1300 disposed over the substrate 550 for forming the DPDs 530 as a photomask. In this case, the ion implantation process may be carried out with significantly high energy in a manner that each DPD 530 can be formed to have a predetermined depth from the top surface of the substrate 550.

Referring to FIG. 13C, the cross-sectional view of the pixel array 500 taken along the second cutting line Y-Y' shown in FIG. 13A is illustrated. Likewise, each DPD 530 can be formed to have a predetermined depth from the top surface of the substrate 550 at a predetermined position contained in the substrate 550.

Figure 14A:
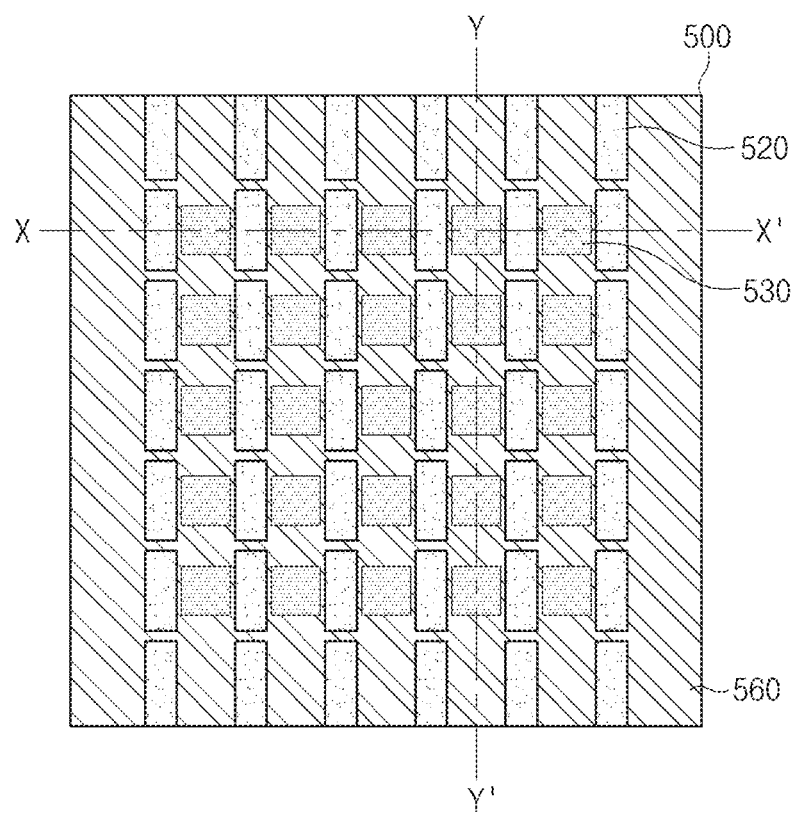
FIG. 14A is a layout diagram illustrating an example of a pixel array that can be used in a fourth fabrication process based on some implementations of the disclosed technology.
Figure 14B:
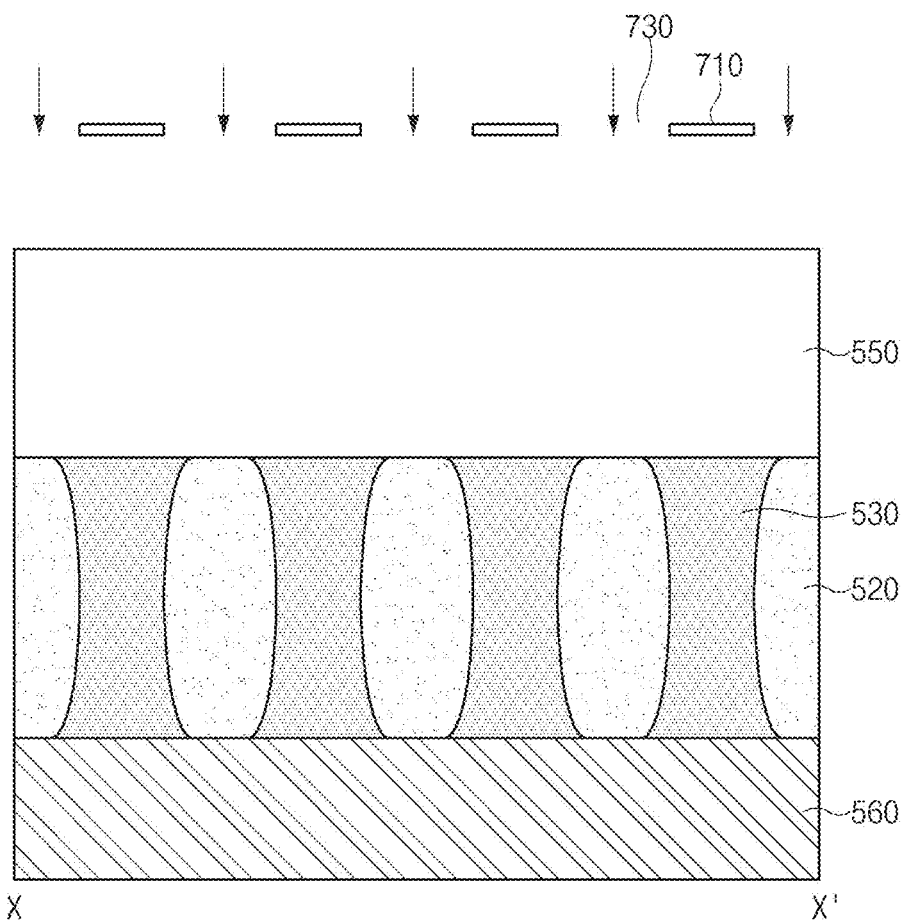
FIG. 14B is a cross-sectional view illustrating an example of the pixel array taken along a first cutting line shown in FIG. 14A based on some implementations of the disclosed technology.
Figure 14C:
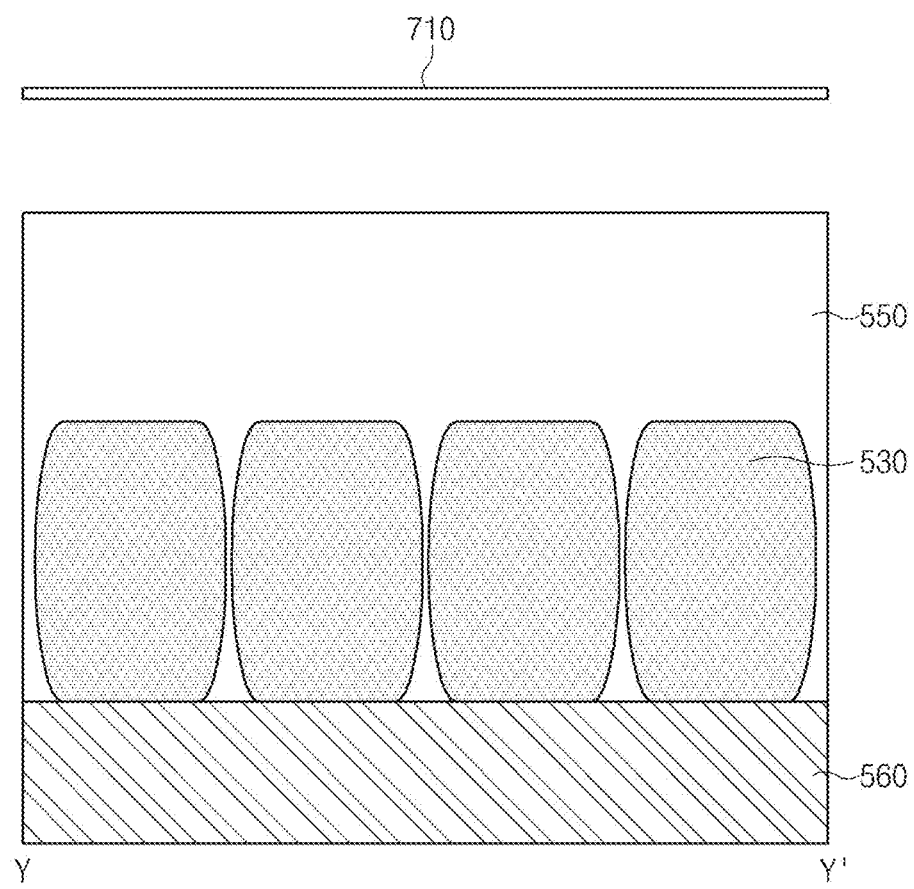
FIG. 14C is a cross-sectional view illustrating an example of the pixel array taken along a second cutting line shown in FIG. 14A based on some implementations of the disclosed technology.

FIG. 14A is a layout diagram illustrating an example of the pixel array 500 that can be used in a fourth fabrication process. FIG. 14B is a cross-sectional view illustrating an example of the pixel array 500 taken along a first cutting line X-X' shown in FIG. 14A. FIG. 14C is a cross-sectional view illustrating an example of the pixel array 500 taken along a second cutting line Y-Y' shown in FIG. 14A.

Referring to FIG. 14A, the pixel array 500 that can be used in the fourth process may include the second DPD isolation layers 520 that are spaced apart from each other by a second distance in the second direction (i.e., in the column direction of the pixel array 500), and at the same time may be consecutively arranged. That is, the second DPD isolation layers 520 are consecutively arranged at regular intervals in a column direction.

Referring to FIG. 14B, the cross-sectional view of the pixel array 500 taken along the first cutting line X-X' shown in FIG. 14A is illustrated. The ion implantation process may be carried out using the second photoresist 700 disposed over the substrate 550 for forming the second DPD isolation layers 520 as a photomask. That is, ions for forming the second DPD isolation layers 520 may be implanted through the open region 730 interposed between the contiguous main patterns 710. In this case, the ion implantation process may be carried out with significantly high energy in a manner that each of the second DPD isolation layers 520 can be formed to have a predetermined depth (corresponding to the DPD 530) from the top surface of the substrate 550.

Referring to FIG. 14C, the cross-sectional view of the pixel array 500 taken along the second cutting line Y-Y' shown in FIG. 14A is illustrated. The main patterns 710 may be disposed across the entire region corresponding to the second cutting line Y-Y', such that the second DPD isolation layers 520 may not be formed.

Figure 15A:
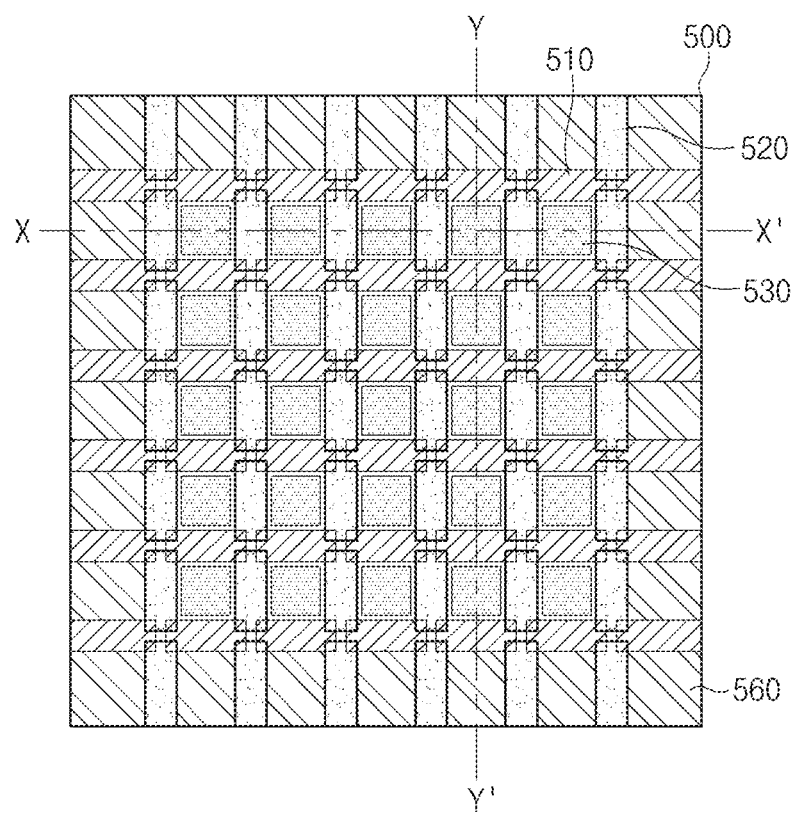
FIG. 15A is a layout diagram illustrating an example of a pixel array that can be used in a fifth fabrication process based on some implementations of the disclosed technology.
Figure 15B:
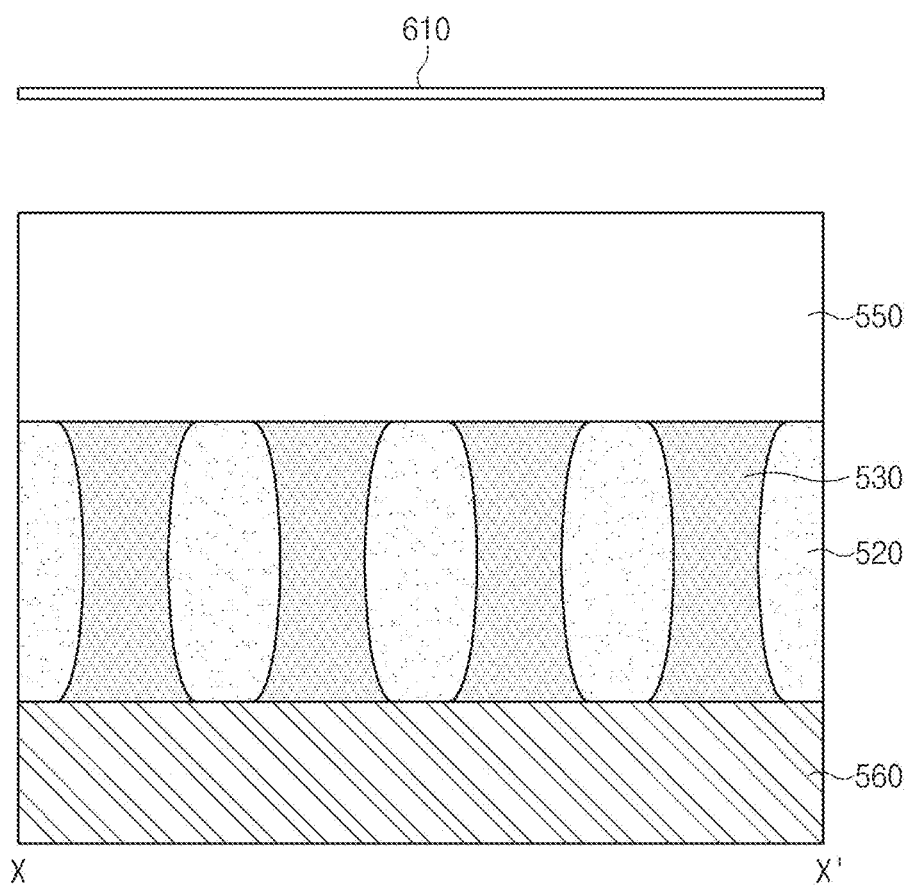
FIG. 15B is a cross-sectional view illustrating an example of the pixel array taken along a first cutting line shown in FIG. 15A based on some implementations of the disclosed technology.
Figure 15C:
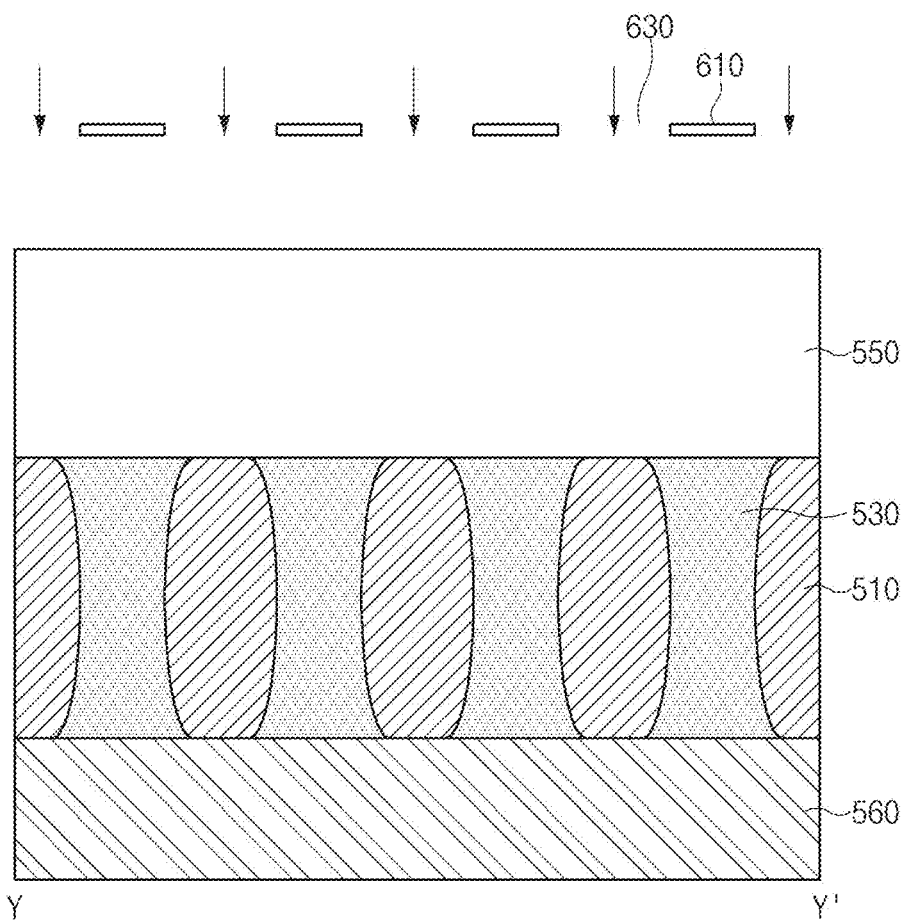
FIG. 15C is a cross-sectional view illustrating an example of the pixel array taken along a second cutting line shown in FIG. 15A based on some implementations of the disclosed technology.

FIG. 15A is a layout diagram illustrating an example of the pixel array 500 that can be used in a fifth fabrication process. FIG. 15B is a cross-sectional view illustrating an example of the pixel array 500 taken along a first cutting line X-X' shown in FIG. 15A. FIG. 15C is a cross-sectional view illustrating an example of the pixel array 500 taken along a second cutting line Y-Y' shown in FIG. 15A.

Referring to FIG. 15A, the pixel array 500 for the fifth process may include the first DPD isolation layers 510 that are spaced apart from each other by a first distance in the first direction (i.e., in the row direction of the pixel array 500), and at the same time may be consecutively arranged. That is, the first DPD isolation layers 510 are consecutively arranged at regular intervals in a row direction.

Referring to FIG. 15B, the cross-sectional view of the pixel array 500 taken along the first cutting line X-X' shown in FIG. 15A is illustrated. The main patterns 610 may be disposed across the entire region corresponding to the first cutting line X-X', such that the first DPD isolation layers 510 may not be formed.

Referring to FIG. 15C, the cross-sectional view of the pixel array 500 taken along the second cutting line Y-Y' shown in FIG. 15A is illustrated. The ion implantation process may be carried out using the first photoresist 600 disposed over the substrate 550 for forming the first DPD isolation layers 510 as a photomask. That is, ions for forming the first DPD isolation layers 510 may be implanted through the open region 630 interposed between the contiguous main patterns 610. In this case, the ion implantation process may be carried out with significantly high energy in a manner that each of the first DPD isolation layers 510 can be formed to have a predetermined depth (corresponding to the DPD 530) from the top surface of the substrate 550.

Although the above-mentioned embodiments have exemplarily disclosed that the fifth fabrication process is performed after completion of the fourth fabrication process for convenience of description, the scope or spirit of the disclosed technology is not limited thereto, and it should be noted that the first fabrication process is first performed and the fourth fabrication process is then performed as necessary.

Figure 16A:
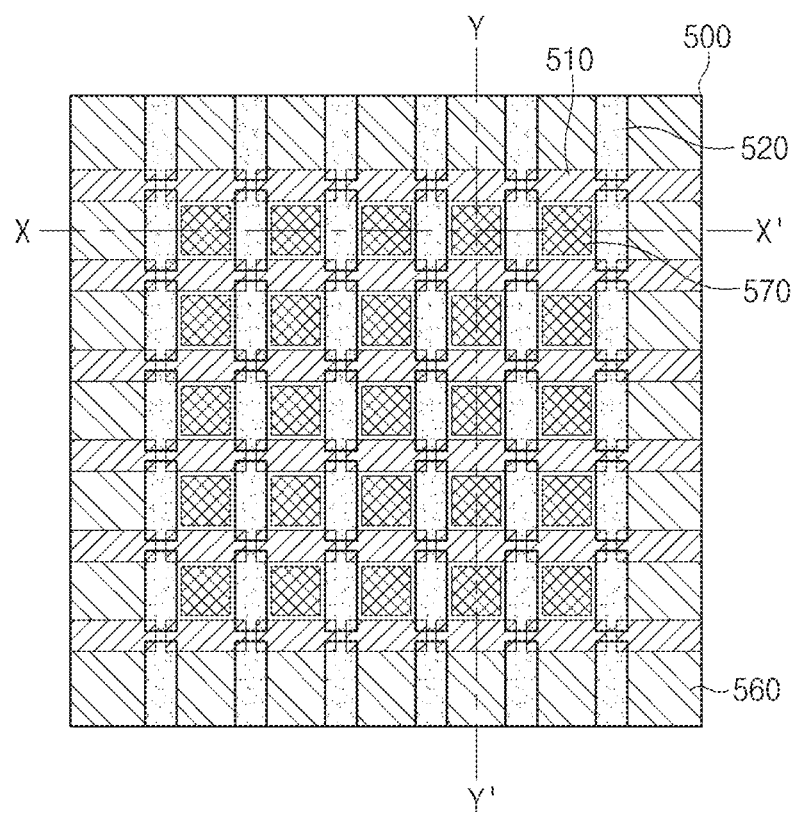
FIG. 16A is a layout diagram illustrating an example of a pixel array that can be used in a sixth fabrication process based on some implementations of the disclosed technology.
Figure 16B:
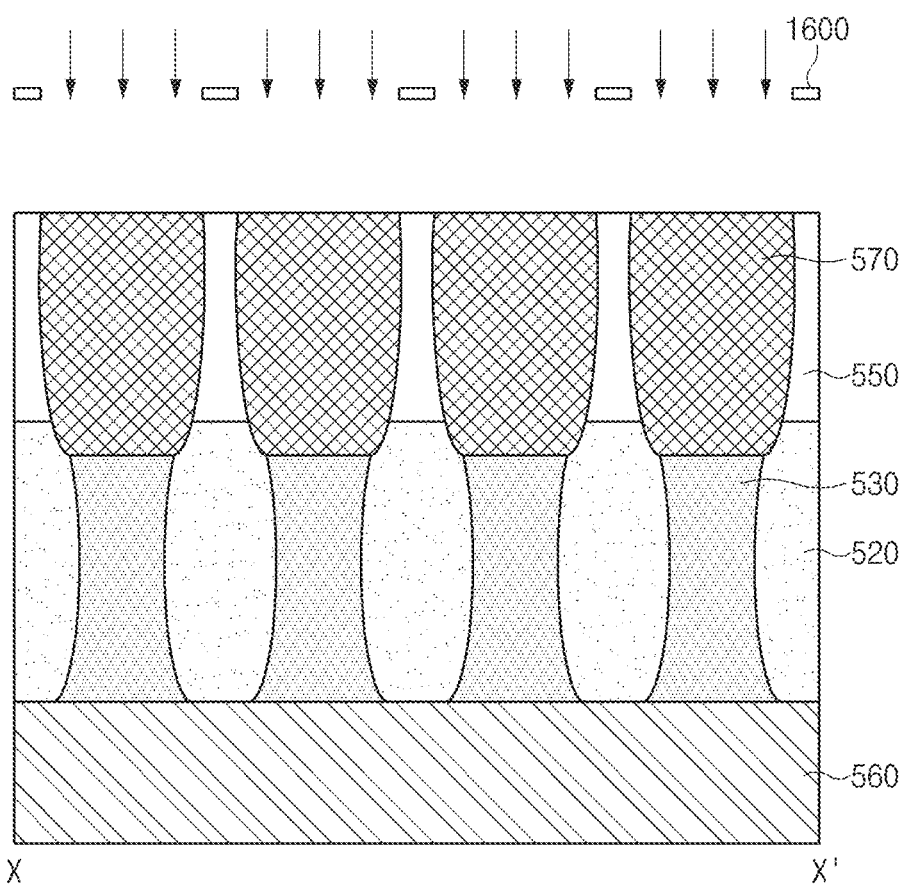
FIG. 16B is a cross-sectional view illustrating an example of the pixel array taken along a first cutting line shown in FIG. 16A based on some implementations of the disclosed technology.
Figure 16C:
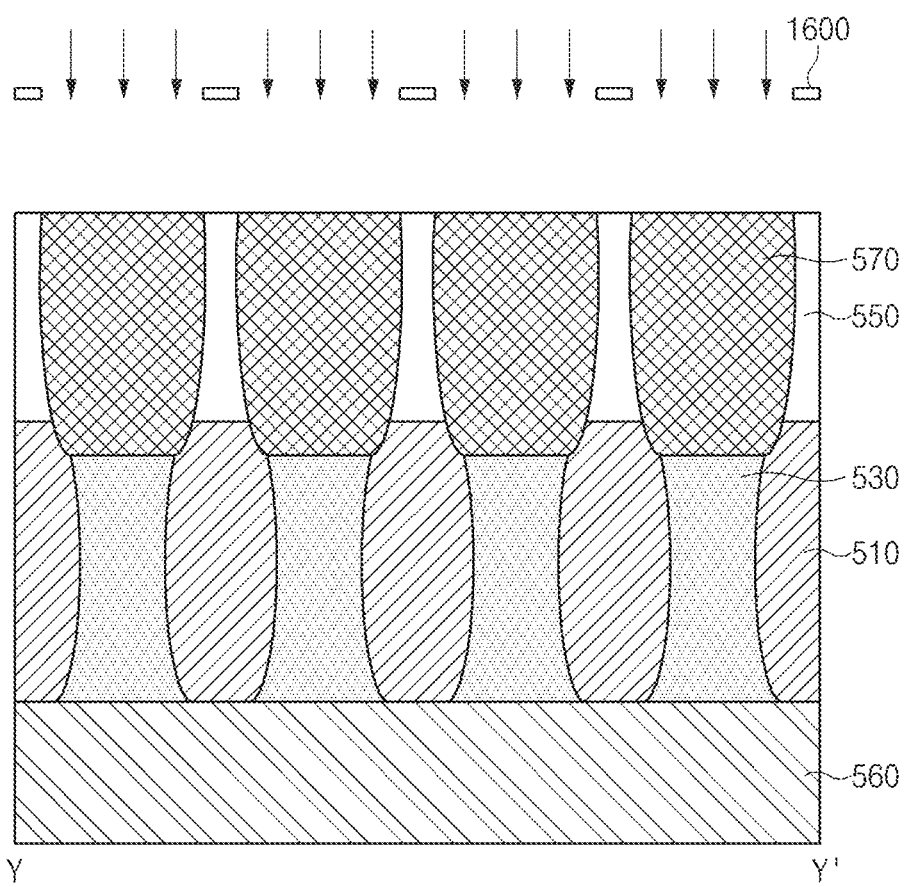
FIG. 16C is a cross-sectional view illustrating an example of the pixel array taken along a second cutting line shown in FIG. 16A based on some implementations of the disclosed technology.

FIG. 16A is a layout diagram illustrating an example of the pixel array 500 that can be used in a sixth fabrication process. FIG. 16B is a cross-sectional view illustrating an example of the pixel array 500 taken along a first cutting line X-X' shown in FIG. 16A. FIG. 16C is a cross-sectional view illustrating an example of the pixel array 500 taken along a second cutting line Y-Y' shown in FIG. 16A.

Referring to FIG. 16A, the pixel array 500 for the sixth fabrication process may include SPDs 570 that are spaced apart from each other by a predetermined distance at preset positions (corresponding to the DPDs 530), so that the SPDs 570 may be formed in a matrix shape.

Referring to FIG. 16B, the cross-sectional view of the pixel array 500 taken along the first cutting line X-X' shown in FIG. 16A is illustrated. The ion implantation process may be carried out using the photoresist pattern 1600 disposed over the substrate 550 for forming the SPDs 570 as a photomask. In this case, the ion implantation process may be carried out with relatively lower energy than energy needed to form the DPDs 530, such that the SPDs 570 can be formed to have a predetermined depth closer to the top surface of the substrate 550.

Referring to FIG. 16C, the cross-sectional view of the pixel array 500 taken along the second cutting line Y-Y' shown in FIG. 16A is illustrated. Likewise, the SPDs 570 may be formed to have a predetermined depth closer to the top surface of the substrate 550 at preset positions contained in the substrate 550.

Figure 17A:
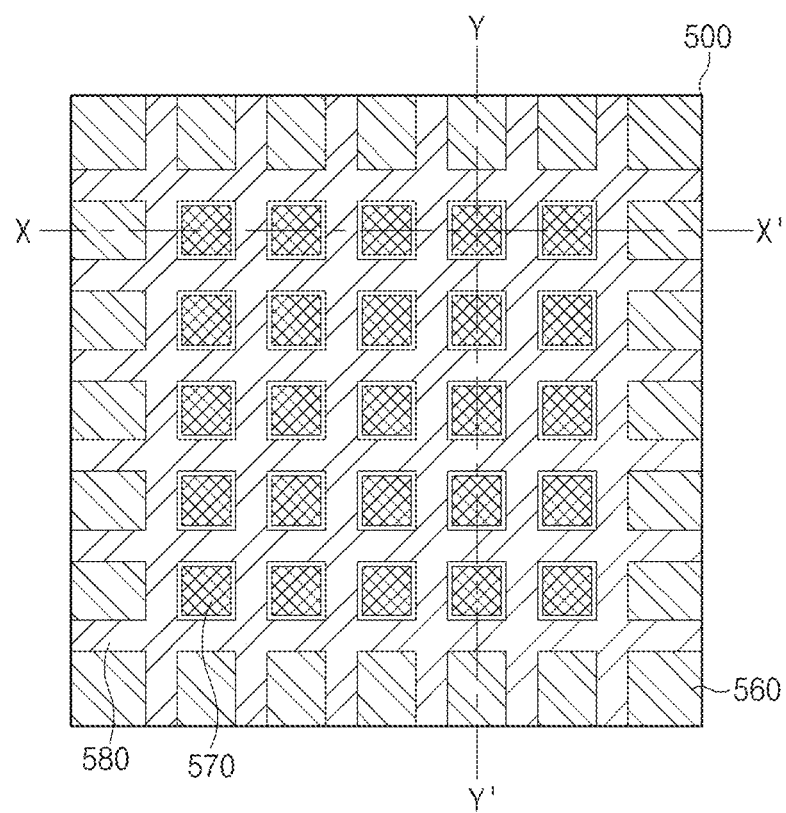
FIG. 17A is a layout diagram illustrating an example of a pixel array that can be used in a seventh fabrication process based on some implementations of the disclosed technology.
Figure 17B:
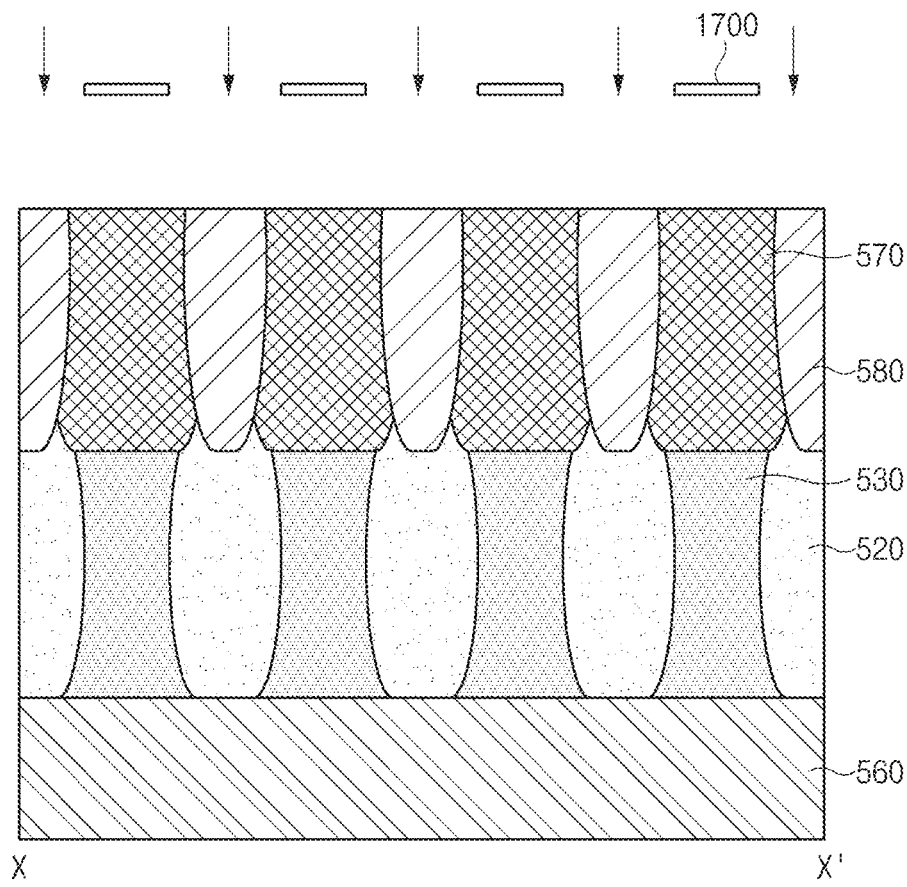
FIG. 17B is a cross-sectional view illustrating an example of the pixel array taken along a first cutting line shown in FIG. 17A based on some implementations of the disclosed technology.
Figure 17C:
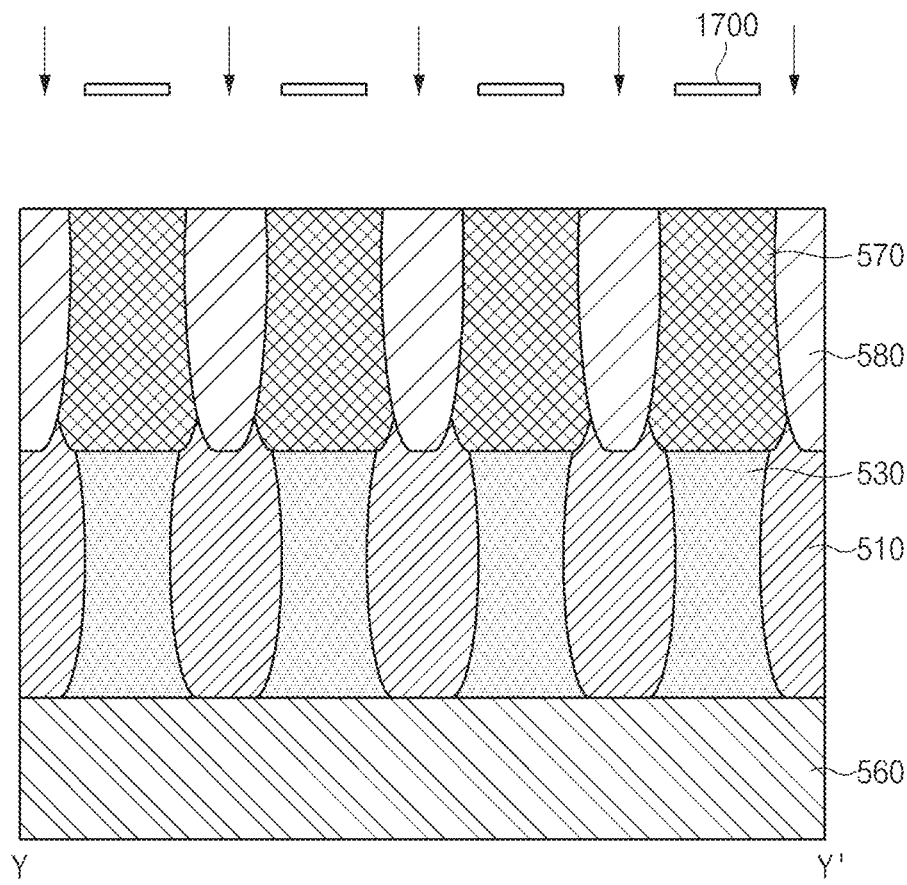
FIG. 17C is a cross-sectional view illustrating an example of the pixel array taken along a second cutting line shown in FIG. 17A based on some implementations of the disclosed technology.

FIG. 17A is a layout diagram illustrating an example of the pixel array 500 that can be used in a seventh fabrication process. FIG. 17B is a cross-sectional view illustrating an example of the pixel array 500 taken along a first cutting line X-X' shown in FIG. 17A. FIG. 17C is a cross-sectional view illustrating an example of the pixel array 500 taken along a second cutting line Y-Y' shown in FIG. 17A.

Referring to FIG. 17A, the pixel array 500 may include SPS isolation layers 580 extending in the first and second directions.

Referring to FIG. 17B, the cross-sectional view of the pixel array 500 taken along the first cutting line X-X' shown in FIG. 17A is illustrated. The ion implantation process may be carried out using the photoresist pattern 1700 disposed over the substrate 550 for forming the SPD isolation layers 580 as a photomask. The photoresist pattern 1700 may be disposed at positions corresponding to the SPDs 570, such that ions for forming the SPD isolation layers 580 can be implanted through a region in which the photoresist pattern 1700 is not disposed. In this case, the ion implantation process may be carried out with relatively low energy in a manner that each of the SPD isolation layers 580 can be formed to have a predetermined depth (corresponding to the SPDs 570) closer to the top surface of the substrate 550.

Referring to FIG. 17C, the cross-sectional view of the pixel array 500 taken along the second cutting line Y-Y' shown in FIG. 17A is illustrated. Likewise, each of the SPD isolation layers 580 may be formed to have a predetermined depth closer to the top surface of the substrate 550 at preset positions contained in the substrate 550. Differently from the DPD isolation layers 510 and 520, the SPD isolation layers 580 may be formed using only one process. Since energy for the ion implantation process for forming the SPD isolation layers 580 is at a relatively low energy level, a thickness of the photoresist pattern 1700 need not be increased, such that no problems may occur in the photoresist pattern for forming the DPD isolation layers.

According to another embodiment, the SPD isolation layers may be formed twice using the ladder-type photoresist patterns in the same manner as forming the DPD isolation layers 510 and 520. Therefore, a blank region may also be formed between the adjacent SPD isolation layers.

In accordance with various embodiments, each (e.g., a module or program) of the above-mentioned constituent elements may include one or more entities. In accordance with various embodiments, at least one constituent element from among the above-mentioned constituent elements or at least one operation may be omitted, or one or more other constituent elements or one or more other operations may be added. Alternatively or additionally, the plurality of constituent elements (e.g., modules or programs) may be integrated into only one constituent element. In this case, the integrated constituent element may perform one or more functions of each of the plurality of constituent elements in the same way as or in a similar way to the previous operation that has been executed by the corresponding constituent element from among the plurality of constituent elements prior to execution of such integration. According to various embodiments, operations performed by a module, a program, or another constituent element may be sequentially, parallelly, repeatedly, or heuristically executed, at least one of the above operations may be executed in different order or omitted, or another operation may be added.

As is apparent from the above description, the image sensor based on some implementations of the disclosed technology can provide a fabrication process for guaranteeing fabrication stability without deteriorating performance of the image sensor.

The embodiments of the disclosed technology may provide a variety of effects capable of being directly or indirectly recognized through the above-mentioned patent document.

Those skilled in the art will appreciate that the disclosed technology may be carried out in other specific ways than those set forth herein without departing from the spirit and essential characteristics of the disclosed technology. The above embodiments are therefore to be construed in all aspects as illustrative and not restrictive. The scope of the disclosed technology should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the disclosed technology or included as a new claim by a subsequent amendment after the application is filed.

Although a number of illustrative embodiments consistent with the disclosed technology have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An image sensor comprising:
    a plurality of photodiodes arranged in first and second directions in a matrix;
    a plurality of first isolation layers, each two adjacent first isolation layers arranged in the first direction being spaced apart from each other by a first distance, each first isolation layer being interposed between adjacent photodiodes arranged in the second direction; and
    a plurality of second isolation layers, each two adjacent second isolation layers arranged in the second direction being spaced apart from each other by a second distance, each second isolation layer being interposed between adjacent photodiodes arranged in the first direction,
    wherein a space between two adjacent first isolation layers arranged in the first direction and a space between two adjacent second isolation layers arranged in the second direction overlap to form a blank region surrounded by the two adjacent first isolation layers and the two adjacent second isolation layers within a substrate including the first isolation layers and the second isolation layers.

2. The image sensor according to claim 1, wherein each of the plurality of photodiodes is formed to have a predetermined depth from a top surface of the substrate.

3. The image sensor according to claim 1, wherein the first distance is equal to or less than a distance between the contiguous photodiodes arranged in the first direction.

4. The image sensor according to claim 1, wherein the second distance is equal to or less than a distance between the contiguous photodiodes arranged in the second direction.

5. The image sensor according to claim 1, wherein:
    a horizontal length of each of the first isolation layers is equal to or greater than a horizontal length of each of the photodiodes.

6. The image sensor according to claim 1, wherein:
    a vertical length of each of the second isolation layers is equal to or greater than a vertical length of each of the photodiodes.

7. The image sensor according to claim 1, wherein the blank region is formed to have a horizontal length corresponding to the first distance and a vertical length corresponding to the second distance.

8. The image sensor according to claim 1, wherein:
the first direction is a row direction of a pixel array; and
the second direction is a column direction of the pixel array.

9. The image sensor according to claim 1, wherein:
the first isolation layers and the second isolation layers are arranged at regular intervals in the first and second directions, respectively.

10. The image sensor according to claim 1, further comprising:
a plurality of third isolation layers formed to extend in the first direction while being interposed between the adjacent photodiodes, and integrated into one structure; and
a plurality of fourth isolation layers formed to extend in the second direction while being interposed between the adjacent photodiodes, and integrated into one structure.

11. The image sensor according to claim 10, wherein the first isolation layers and the third isolation layers are alternately arranged in the second direction.

12. The image sensor according to claim 10, wherein the second isolation layers and the fourth isolation layers are alternately arranged in the first direction.

13. The image sensor according to claim 10, wherein:
the blank region is not formed at an intersection region between the third isolation layer and the extension line through which the second isolation layers are coupled to each other, or is not formed at an intersection region between the third isolation layer and the fourth isolation layers.

14. The image sensor according to claim 10, wherein:
the blank region is not formed at an intersection region between the fourth isolation layer and the extension line through which the first isolation layers are coupled to each other, or is not formed at an intersection region between the fourth isolation layer and the third isolation layers.

15. The image sensor according to claim 10, wherein the photodiodes includes a deep photodiode (DPD) and a shallow photodiode (SPD) formed over the DPD,
each first isolation layer is interposed between adjacent DPDs arranged in the second direction, and
each second isolation layer is interposed between adjacent DPDs arranged in the first direction.

* * * * *